(12) United States Patent
Tani et al.

(10) Patent No.: US 6,580,095 B2
(45) Date of Patent: Jun. 17, 2003

(54) CIRCUIT-CONTAINING PHOTODETECTOR, METHOD OF MANUFACTURING THE SAME, AND OPTICAL DEVICE USING CIRCUIT-CONTAINING PHOTODETECTOR

(75) Inventors: Yoshihiko Tani, Tenri (JP); Shigeki Hayashida, Nara (JP); Tatsuya Morioka, Ikoma (JP); Seizo Kakimoto, Nara (JP); Toshihiko Fukushima, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/874,997

(22) Filed: Jun. 7, 2001

(65) Prior Publication Data

US 2002/0047175 A1 Apr. 25, 2002

(30) Foreign Application Priority Data

Jun. 7, 2000 (JP) .................................. 2000-170772
Apr. 25, 2001 (JP) .................................. 2001-127655

(51) Int. Cl.$^7$ ................................................ H01L 27/15
(52) U.S. Cl. .......................... 257/79; 257/80; 257/380; 257/435
(58) Field of Search ............................ 257/79, 80, 380, 257/435, 538

(56) References Cited

U.S. PATENT DOCUMENTS

| 5,751,050 A | * | 5/1998 | Ishikawa et al. | ............. | 257/538 |
| 5,977,598 A | * | 11/1999 | Chen et al. | .................. | 257/380 |
| 6,078,707 A | * | 6/2000 | Yamamoto et al. | ............ | 385/14 |
| 6,127,715 A | * | 10/2000 | Yamamoto et al. | ......... | 257/459 |

* cited by examiner

*Primary Examiner*—David Nelms
*Assistant Examiner*—Dao H. Nguyen
(74) *Attorney, Agent, or Firm*—Birch, Stewart, Kolasch & Birch, LLP

(57) ABSTRACT

A circuit-containing photodetector is provided which can have a high sensitivity and response to light of a short wavelength and can be manufactured in a good yield. The circuit-containing photodetector includes a semiconductor substrate, a semiconductor layer formed thereon, and a conductive impurity region formed in the semiconductor layer for transmitting a signal. In the semiconductor layer, a trench is formed to have a depth to reach the substrate. An impurity region of a photodetector element is formed at the surface of the semiconductor substrate exposed at the bottom of the trench. A signal processing circuit for processing an electric signal from the photodetector element is formed on the semiconductor layer. The conductive impurity region for transmitting the electric signal from the photodetector element is formed to extend from the bottom of the trench to the upper surface of the semiconductor layer.

11 Claims, 21 Drawing Sheets

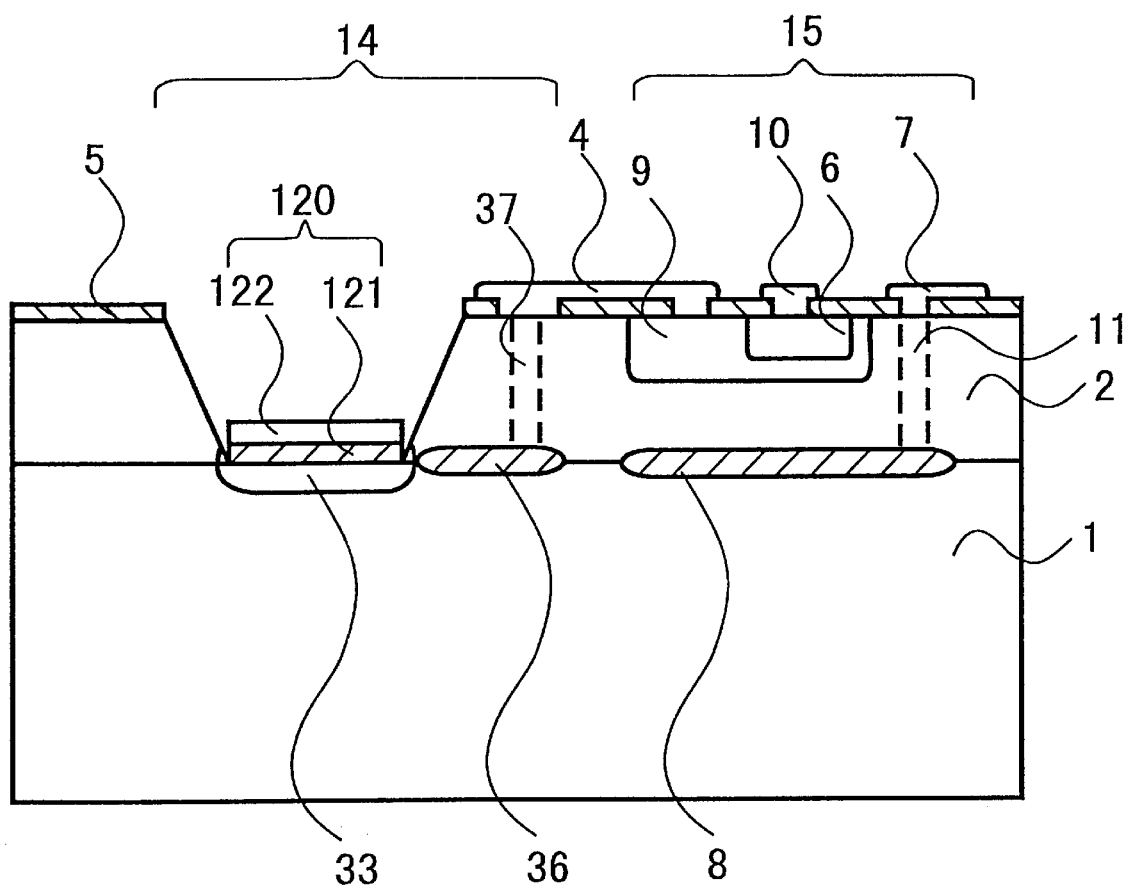

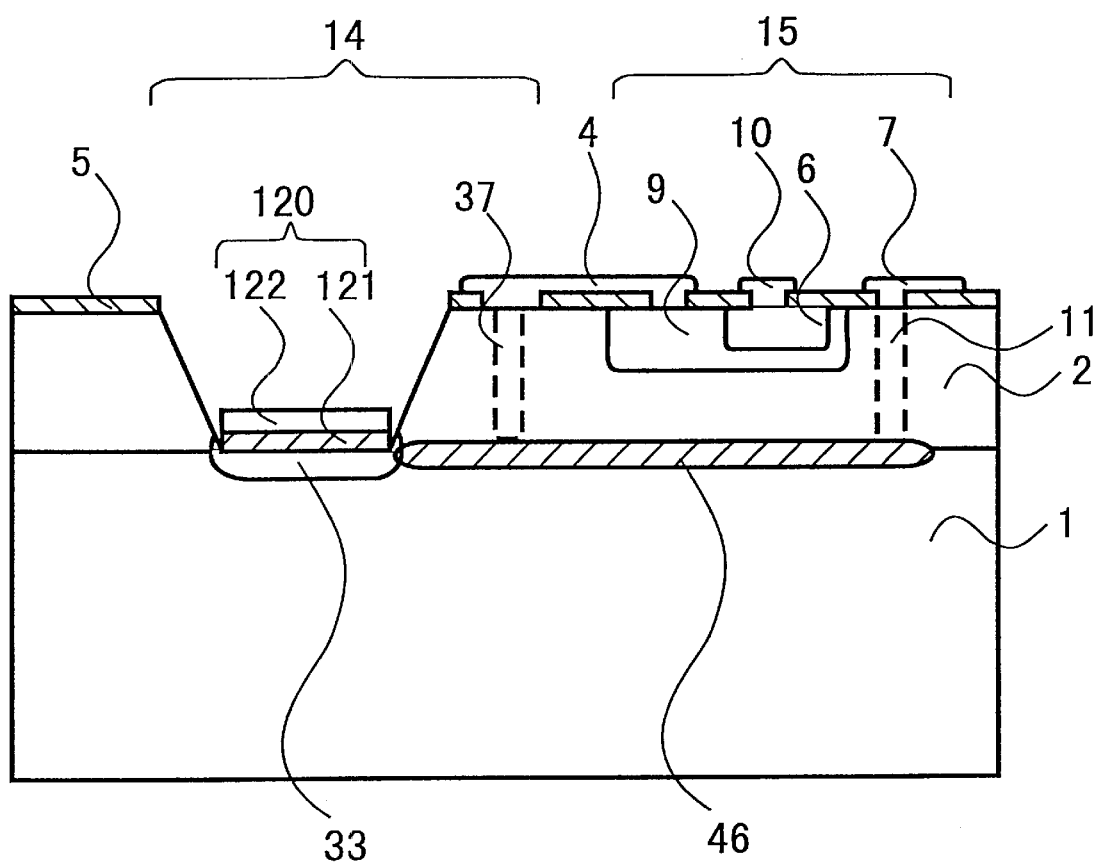

CIRCUIT-CONTAINING PHOTODETECTOR, METHOD OF MANUFACTURING THE SAME, AND OPTICAL DEVICE USING CIRCUIT-CONTAINING PHOTODETECTOR

BACKGROUND OF THE INVENTION

1. Field of the Invention

The present invention relates to a circuit-containing photodetector that includes a photodetector element and a circuit for processing a photoelectrically converted signal supplied from the photodetector element both formed on the same semiconductor substrate. The invention further relates to a method of manufacturing the circuit-containing photodetector and to an optical device using the circuit-containing photodetector.

2. Description of the Background Art

Circuit-containing photodetectors are extensively applied to various optical devices such as optical sensors, optical pickups and photocouplers.

FIG. 21 schematically shows a cross section of a conventional circuit-containing photodetector. It is noted that in the drawings attached hereto, the same reference character denotes the same or corresponding components. Referring to FIG. 21, on a p-type silicon substrate 1 having a specific resistance of 100 Ωcm, for example, an n-type epitaxial silicon layer 2 of 5–8 Ωcm in specific resistance and 2–3 μm in thickness is formed. A photodetector element 14 has a pn junction of p-type silicon substrate 1 and n-type epitaxial layer 2. On a light-receiving surface of photodetector element 14, an antireflection film 120 having a double layer structure of an oxide film 121 and a nitride film 122 is formed. In epitaxial layer 2, the region having photodetector element 14 and the region having a signal processing circuit portion 15 are electrically isolated from each other by a diffused isolation layer 13.

The signal processing circuit typically contains an npn transistor 15, which includes an n-type buried diffusion layer 8 buried in silicon substrate 1, n-type epitaxial layer (collector) 2 thereon, a p-type diffusion layer (base) 9 formed at the surface of the collector, an n-type diffusion layer (emitter) 6 formed at the surface of the base, and a collector compensation diffusion layer 11 extending from n-type buried diffusion layer 8 to the surface of epitaxial layer 2. On epitaxial layer 2, an interlayer insulating film 5, a metal electrode interconnect 4, a collector electrode 7 and an emitter electrode 10 are formed.

Recent years have seen increased density of optical recording, so that a shorter wavelength of signal light has been used for the optical recording. Accordingly, it is desired that the circuit-containing photodetector used for the optical recording should have a high sensitivity and a fast response to the short wavelength light. The conventional circuit-containing photodetector having the structure as shown in FIG. 21, however, can hardly achieve a higher sensitivity and a faster response for the reasons below.

If the signal light has a shorter wavelength, the absorption length of the light in the semiconductor becomes shorter. In silicon, for example, the absorption length is approximately 1 μm for the light having a wavelength of 0.5 μm, while it is 0.2 μm or less for a wavelength of 0.4 μm. In the semiconductor layer, the light absorbed into the depletion layer mainly contributes to the generation of photocurrent. The introduced light has to be absorbed in the vicinity of the pn junction to generate electron-hole pairs near the junction.

Thus, when the signal light has a shorter wavelength, n-type epitaxial layer 2 is required to be thinner for efficient generation of the photocurrent. For example, if the light wavelength is 0.4 μm, epitaxial layer 2 should have a thickness of 1 μm or less. However, epitaxial layer 2 must be as thick as 2 to 3 μm for forming npn transistor 15, so that photodetector element 14 has a low sensitivity to the employed short wavelength.

If a p-type impurity region having a junction depth of 1 μm or less is formed at the surface of n-type epitaxial layer 2 in photodetector element 14, the photodetector element portion may have a high sensitivity to the short wavelength of the signal light. However, epitaxial layer 2 should have a low specific resistance (e.g. 5–8 Ωcm) for forming transistor 15, so that the photodetector element has a relatively high junction capacitance resulting in a slower response rate.

For the above reasons, the above conventional circuit-containing photodetector can hardly achieve both of a higher sensitivity and a faster response to a short wavelength light introduced into the photodetector element.

As a solution of such a problem, Japanese Patent Laying-Open No. 1-232774 discloses a method of producing a circuit-containing photodetector as mentioned below. In the method, as shown in FIG. 20A, an n-type epitaxial layer 2 having a specific resistance (5–8 Ωcm) and a thickness suitable for a transistor is grown on an n-type silicon substrate 1 having a specific resistance (80–100 Ωcm) and a thickness that are suitable for a photodetector element. At this time, an n-type high concentration buried layer 8 is also formed.

Referring to FIG. 20B, epitaxial layer 2 is partially etched away in the region that will provide a photodetector element, so that a trench is formed and silicon substrate 1 is partially exposed at the bottom of the trench.

Referring to FIG. 20C, an impurity region 3 is formed by diffusion at the bottom substrate surface of the trench, and simultaneously a base region 9 is formed by diffusion at the surface of epitaxial layer 2 in the region that will provide a transistor portion. Further, an emitter 6 is formed at the surface of base region 9 by diffusion.

In the circuit-containing photodetector as shown in FIG. 20C, photodetector element 14 can be formed to have both of a high sensitivity and a fast response to the short wavelength of signal light without the transistor characteristics degraded.

As mentioned above, epitaxial layer 2 should have a thickness of 2 to 3 μm for forming therein a signal processing circuit such as a transistor. Accordingly, the depth of the trench should also be 2 to 3 μm at photodetector element 14 formed in the circuit-containing photodetector as shown in FIG. 20C.

In this case, photodetector element 14 formed at the bottom of the trench needs a metal electrode interconnect 4 that extends from an anode 3 to the upper surface of epitaxial layer 2 rising 2 to 3 μm out of the bottom of the trench.

Such a great rising in the trench, however, causes a problem as follows. When a pattern of metal electrode interconnect 4 is formed by means of photolithography, the light cannot uniformly be focused over the entire area of metal interconnect 4. The resulting line of metal interconnect 4 may have a narrowed width which is likely to cause a defect such as breaking of the line.

SUMMARY OF THE INVENTION

The present invention reflects the above-described problems in the conventional technique. Thus, an object of the present invention is to provide a structure of a circuit-containing photodetector that can not only have a high sensitivity and a fast response to signal light of short wavelength but be manufactured in high yield, and to provide a method of manufacturing such a circuit-containing photodetector.

According to the present invention, a circuit-containing photodetector is provided that has a semiconductor substrate, a photodetector element formed on the semiconductor substrate, and a circuit for processing an electric signal from the photodetector element. The circuit-containing photodetector includes (a) a semiconductor layer which is grown on the semiconductor substrate and on which the circuit is formed, (b) a trench which is formed in the semiconductor layer and has a depth to reach the semiconductor substrate, (c) an impurity region formed at a surface of the semiconductor substrate exposed at the bottom of the trench, the impurity region constituting the photodetector element, and (d) a conductive impurity region extending from the impurity region of the photodetector element to an upper surface of the semiconductor layer for transmitting the electric signal from the photodetector element to the circuit.

In the device according to the present invention, the conductive impurity region may be formed in the semiconductor layer to extend from the bottom of the trench to the upper surface of the semiconductor layer.

On the other hand, in the device according to the present invention, the conductive impurity region may be composed of a substrate impurity region formed at a portion of the semiconductor substrate that is adjacent to the trench, and a semiconductor layer impurity region formed in the semiconductor layer to extend from the substrate impurity region to the upper surface of the semiconductor layer. In this case, a buried diffusion layer for the circuit may be formed at a portion of the substrate distant from the substrate impurity region, or the substrate impurity region for transmitting a signal may also serve as a buried diffusion layer for the circuit. Further, a collector compensation diffusion layer for the circuit may be formed at a portion of the semiconductor layer distant from the semiconductor layer impurity region, or the semiconductor layer impurity region for transmitting a signal may also serve as a collector compensation diffusion layer for the circuit.

According to the present invention, the photodetector element may include a plurality of impurity regions of the photodetector element.

According to the present invention, is provided a method of manufacturing the circuit-containing photodetector as stated above. The manufacturing method includes the steps of (a) partially etching a semiconductor layer grown on a semiconductor substrate to form a trench in the semiconductor layer and (b) doping with impurities a portion of the semiconductor substrate exposed at the bottom of the trench and a side portion of the trench to form an impurity region that constitutes a photodetector element and to form a conductive impurity region for transmitting an electric signal from the photodetector element.

According to the present invention, is provided another method of manufacturing the circuit-containing photodetector as stated above. The manufacturing method includes the steps of (a) doping with impurities specific portions of a semiconductor substrate and a semiconductor layer grown on the semiconductor substrate and (b) partially etching the doped specific portions to form a trench. In the step of forming the trench, an impurity region that constitutes a photodetector element and a conductive impurity region for transmitting an electric signal from the photodetector element are formed in the remaining part of the specific portions.

According to the present invention, is provided still another method of manufacturing the circuit-containing photodetector as stated above. The manufacturing method includes the steps of (a) doping with impurities specific portions of a semiconductor substrate and a semiconductor layer grown on the semiconductor substrate, (b) partially etching the doped specific portions to form a trench, wherein a conductive impurity region for transmitting an electric signal from a photodetector element is formed in the remaining part of the specific portions, and (c) doping with impurities the bottom of the trench to form an impurity region that constitutes the photodetector element.

According to the present invention, is provided a further method of manufacturing the circuit-containing photodetector as stated above. The manufacturing method includes the steps of (a) doping with impurities a specific surface portion of a semiconductor substrate to form a first impurity region, (b) growing a semiconductor layer on the semiconductor substrate, (c) partially etching the semiconductor layer to form a trench in the semiconductor layer, (d) doping with impurities the bottom of the trench to form a second impurity region in contact with the first impurity region, and (e) doping with impurities a specific portion of the semiconductor layer to form a third impurity region extending from the first impurity region to an upper surface of the semiconductor layer. The second impurity region constitutes a photodetector element and the first and third impurity regions form a conductive impurity region for transmitting an electric signal from the photodetector element.

According to the present invention, is provided a still further method of manufacturing the circuit-containing photodetector as stated above. The manufacturing method includes the steps of (a) doping with impurities two adjacent surface portions of a semiconductor substrate to form a first impurity region and a second impurity region, (b) growing a semiconductor layer on the semiconductor substrate, (c) partially etching the semiconductor layer to form a trench in the semiconductor layer, and (d) doping with impurities a specific portion of the semiconductor layer to form a third impurity region extending from the first impurity region to an upper surface of the semiconductor layer. The second impurity region constitutes a photodetector element and the first and third impurity regions form a conductive impurity region for transmitting an electric signal from the photodetector element. In this manufacturing method, the first and second impurity regions may simultaneously be formed.

According to the present invention, another circuit-containing photodetector is provided that has a semiconductor substrate, a photodetector element formed on the semiconductor substrate, and a circuit for processing an electric signal from the photodetector element. The circuit-containing photodetector includes (a) a semiconductor layer which is grown on the semiconductor substrate and on which the circuit is formed, (b) a trench which is formed in the semiconductor layer and has a depth to reach the semiconductor substrate, (c) an impurity region formed at a surface of the semiconductor substrate exposed at the bottom of the trench, the impurity region constituting the photodetector element, and (d) a silicide film formed in self-aligning manner from the bottom of the trench to an upper surface of the semiconductor layer for transmitting the electric signal from the photodetector element to the circuit.

According to the present invention, is provided an optical device including the circuit-containing photodetector.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a cross sectional view schematically showing a circuit-containing photodetector in Example 6 according to the present invention.

FIG. 8 is a cross sectional view schematically showing a circuit-containing photodetector in Example 7 according to the present invention.

DESCRIPTION OF THE PREFERRED EMBODIMENTS

Figure 1:
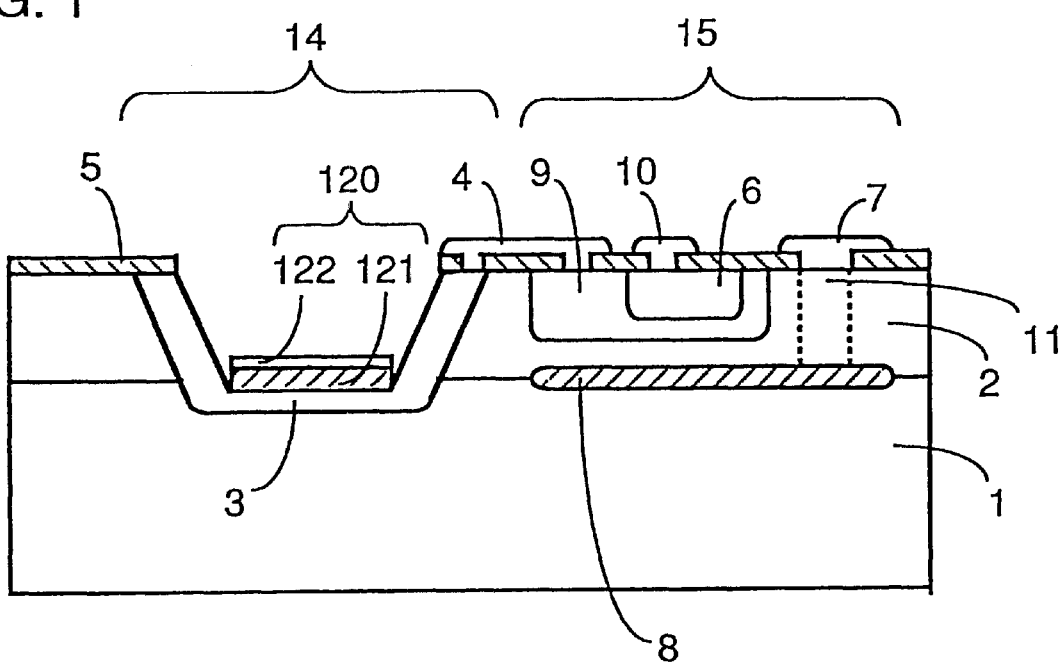
FIG. 1 is a cross sectional view schematically showing a circuit-containing photodetector in Example 1 according to the present invention.

The circuit-containing photodetector according to the present invention includes a trench where a photodetector element is provided, and a conductive impurity region for transmitting an electric signal from the photodetector element to a signal processing circuit. The conductive impurity region is in contact with an impurity region of the photodetector element. The conductive impurity region extends from the impurity region of the photodetector element to an upper surface of a semiconductor growth layer where the circuit is formed. Such a circuit-containing photodetector does not need a metal electrode interconnect that is formed to extend into the trench. The pattern of the metal electrode interconnect may only be formed on the upper surface of the epitaxial layer. Accordingly, an easy focusing in photolithography is accomplished to improve yield in the process of forming the electrode interconnect.

According to the invention, the conductive impurity region is typically formed to extend from the bottom of the trench to the upper surface of the semiconductor growth layer. Specifically, such a conductive impurity region may be formed in the semiconductor growth layer formed on the semiconductor substrate to extend along a sidewall of the trench. Alternatively, the conductive impurity region may be formed to extend from the bottom of the trench through a portion of the semiconductor substrate adjacent to the trench to the upper surface of the semiconductor growth layer. In this case, the conductive impurity region includes an impurity region formed at the semiconductor substrate (substrate impurity region) and an impurity region formed in the semiconductor growth layer (semiconductor layer impurity region). The substrate impurity region is typically formed at a boundary region between the semiconductor substrate and the semiconductor layer grown thereon. The semiconductor layer impurity region is in contact with the substrate impurity region and extends from the substrate impurity region to the upper surface of the semiconductor growth layer formed on the substrate.

According to the invention, a portion of the conductive impurity region that is in contact with a metal interconnect may have a higher impurity concentration than that of the other portion. For example, such a portion preferably has an impurity concentration of at least $1 \times 10^{20}$ cm$^{-3}$. In contrast, the other portion may have an impurity concentration of at least $1 \times 10^{17}$ cm$^{-3}$.

In the circuit-containing photodetector according to the invention, the conductive impurity region for signal transmission may be replaced with a silicide film formed in self-aligning manner. The silicide film is typically obtained by converting a part of the semiconductor layer such as silicon layer grown on the semiconductor substrate into silicide. The silicide film can typically be formed along a sidewall of the trench.

In the invention, silicon is typically used for the semiconductor substrate and the semiconductor layer. However, other semiconductors such as germanium and compound semiconductors including GaP, GaAsP, and InGaAs may be employed.

The circuit-containing photodetector according to the invention can advantageously be used in various optical devices.

The present invention will be described in more detailed manner by Examples.

EXAMPLES

Example 1

FIG. 1 shows a circuit-containing photodetector of Example 1 according to the invention. The photodetector includes a silicon substrate 1 having a specific resistance (e.g. 300 Ωcm) and a thickness that are suitable for a photodetector element. An epitaxial layer 2 is formed on substrate 1. Epitaxial layer 2 has a specific resistance (e.g. 5

Ωcm) and a thickness (e.g. 2–3 μm) suitable for a signal processing circuit such as a transistor that processes a photoelectrically converted signal from the photodetector element. Silicon substrate 1 and epitaxial layer 2 may have the same conductivity type, which may be either n or p.

A photodetector element portion 14 has a trench formed by means of etching to pass through the thickness of epitaxial layer 2. Silicon substrate 1 is partially exposed at the bottom surface of the trench. An impurity region 3 is continuously formed along the bottom surface and a side surface of the trench. Impurity region 3 has a conductivity type opposite to that of silicon substrate 1. For example, if silicon substrate 1 is of p type, impurity region 3 is of n type.

The trench structure described above has a bottom surface portion that is used as a light-receiving surface for signal light. The semiconductor junction depth of the impurities at the bottom surface portion of the trench in impurity region 3 may be optimized depending on the wavelength of the signal light such that a high optical sensitivity can be obtained. For example, if signal light has a wavelength of 0.4 μm, preferably the surface impurity concentration is $10^{17}$ to $10^{20}$ cm$^{-3}$ and the junction depth is 1 μm or less.

The trench side surface portion in impurity region 3 may only serve as a conductive region, and therefore it may have an impurity concentration of at least $10^{17}$ cm$^{-3}$ with no limitation on the junction depth. Impurity region 3 has a part in contact with a metal electrode interconnect 4. The impurity concentration of that part is at least $10^{20}$ cm$^{-3}$ for achieving an ohmic contact.

On the trench bottom surface serving as a light-receiving region are stacked a silicon oxide film 121 and a silicon nitride film 122 each having a uniform thickness. The stacked layers form an antireflection film 120 at the light-receiving surface of the photodetector element. Each of silicon oxide film 121 and silicon nitride film 122 has a suitable thickness for effective antireflection, depending on the wavelength of the signal light. For example, if the signal light used for an optical pickup has a wavelength of 0.4 μm, the silicon oxide film and the silicon nitride film may respectively be 20 nm and 30 nm in thickness to give a surface reflectance of 5% or lower.

A signal processing circuit, including a transistor for example, processes a photoelectrically converted signal supplied from photodetector element 14. Such a circuit is formed on epitaxial layer 2 by means of a conventional technique similar to that shown by FIG. 20C. The technique is described above and therefore is not repeated here.

Figure 20:
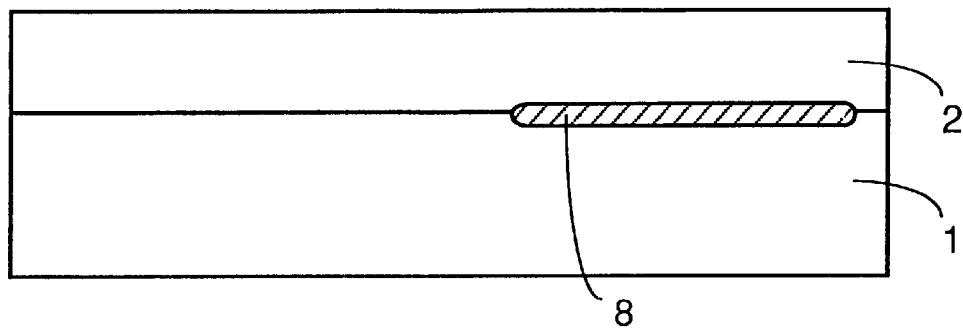
FIGS. 20A to 20C are cross sectional views schematically showing a method of manufacturing a circuit-containing photodetector according to the prior art.
Figure 20:
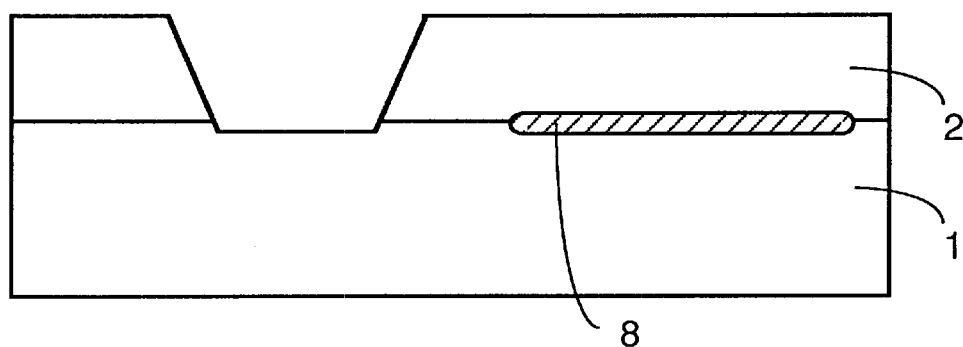
Figure 20:
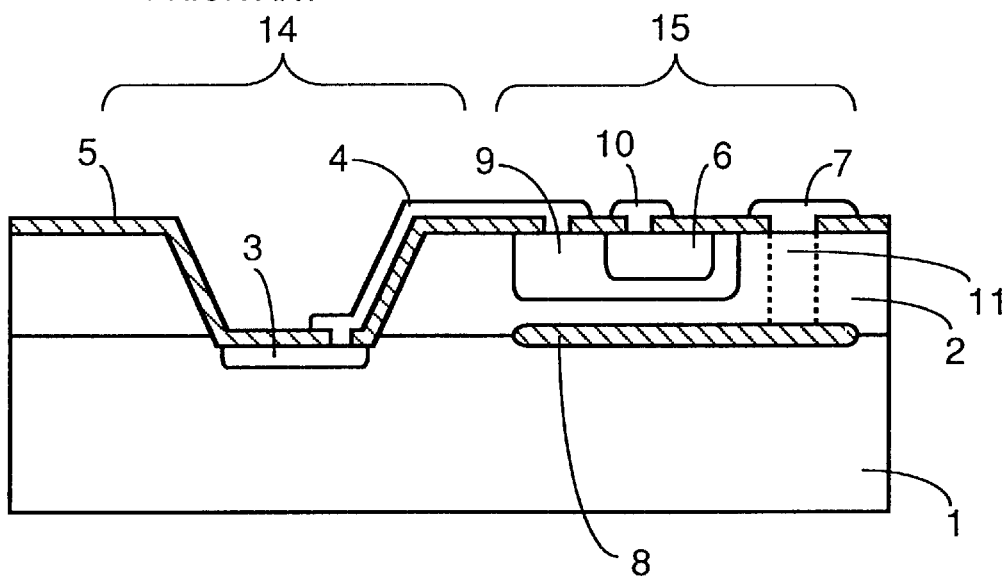
Figure 21:
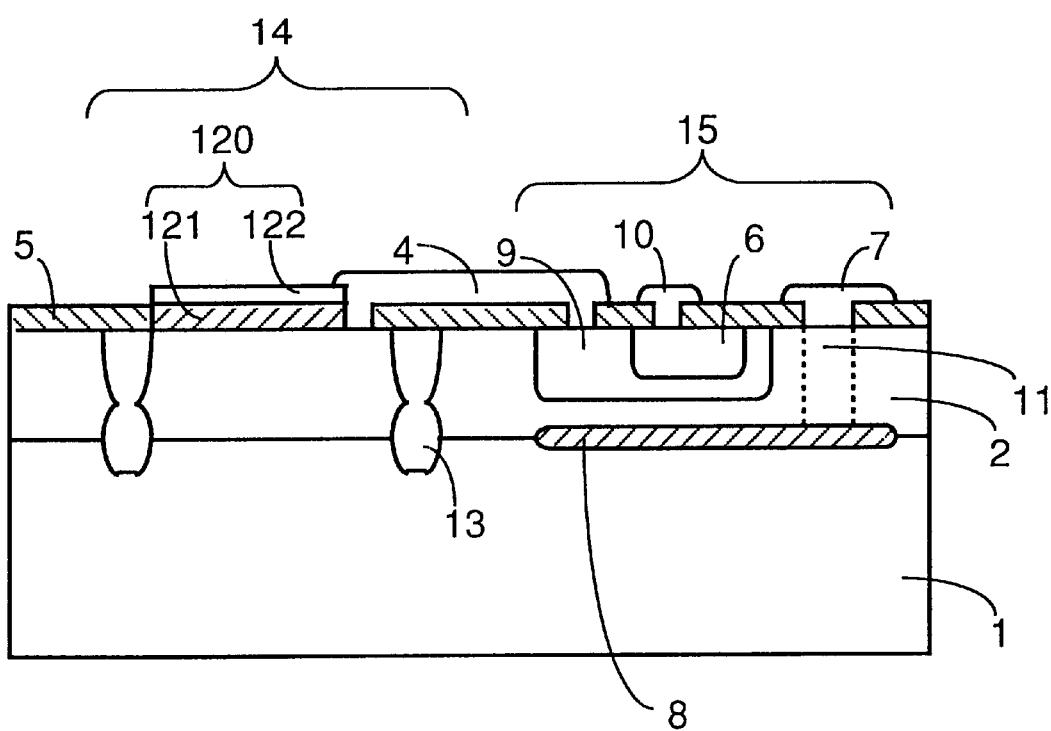
FIG. 21 is a cross sectional view schematically showing a conventional circuit-containing photodetector.

In the circuit-containing photodetector according to the prior art as shown in FIG. 20C, metal electrode interconnect 4 extending from impurity region 3 must be formed from the trench bottom surface to the upper surface of epitaxial layer 2. According to the present invention, however, the circuit-containing photodetector as shown in FIG. 1 has impurity region 3 which is formed on the trench side surface and serves as an electrode interconnect extending from the trench bottom surface to the upper surface of epitaxial layer 2. In such a structure, metal electrode interconnect 4 may be formed only on the upper surface of epitaxial layer 2. In the process of the circuit-containing photodetector according to the invention, the photolithography for making the pattern of metal electrode interconnect 4 may employ the light just focused at the upper surface of epitaxial layer 2 and is not influenced by the rising of the trench structure. Therefore, in the process of the circuit-containing photodetector, defects in metal electrode interconnect 4 can remarkably be reduced, so that the production yield can considerably be improved.

Example 2

In Example 2, the circuit-containing photodetector as shown in FIG. 1 is produced through the manufacturing process as shown in FIGS. 2A to 2D. In the manufacturing process, the trench is formed by etching and then the bottom surface region of the trench and at least a part of the side surface of the trench are doped with impurities so as to simultaneously form the impurity region of the photodetector element and the conductive impurity region for signal transmission.

Figure 2A:
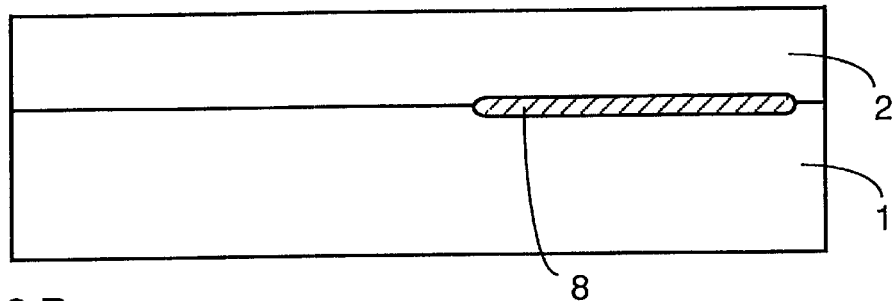
FIGS. 2A to 2D are cross sectional views schematically showing a method of manufacturing the circuit-containing photodetector shown in FIG. 1.

Referring to FIG. 2A, buried diffusion layer 8 is formed at the upper surface of silicon substrate 1 having a specific resistance (e.g. 300 Ωcm) and a thickness suitable for a photodetector element. Epitaxial layer 2 is then grown by a conventional method to have a specific resistance (e.g. 5 Ωcm) and a thickness (e.g. 2–3 μm) suitable for the circuit for processing the photoelectrically converted signal supplied from the photodetector element. Silicon substrate 1 and epitaxial layer 2 have the same conductivity type, which may be either n or p.

Figure 2B:
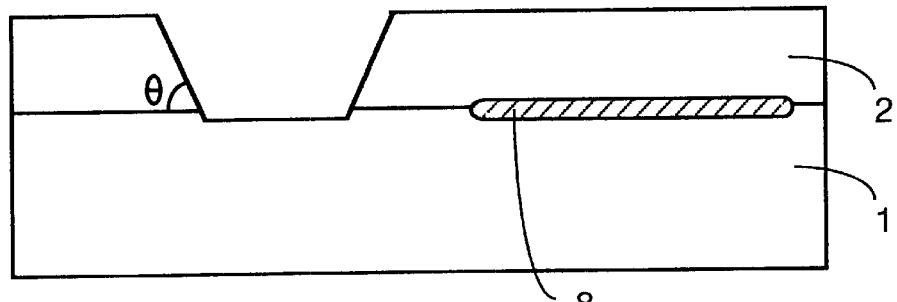

Referring to FIG. 2B, by means of conventional photolithography and etching techniques, the trench is formed to pass through the thickness of epitaxial layer 2 in the region where the photodetector element will be formed. Silicon substrate 1 is partially exposed at the bottom of the trench.

Figure 2C:
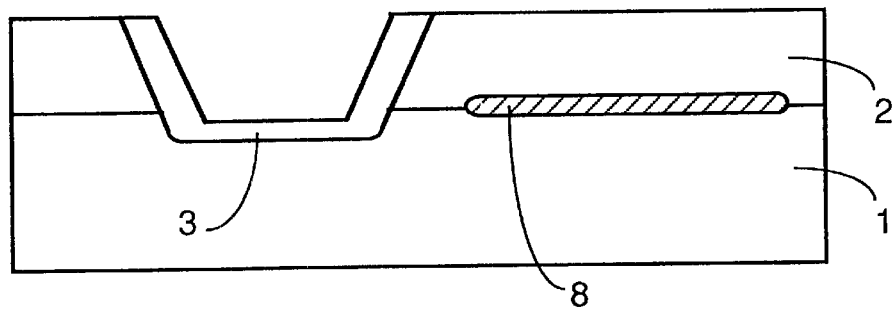

Referring to FIG. 2C, by means of conventional photolithography and techniques such as ion implantation and annealing, solid phase diffusion or the like, impurity region 3 is formed at the bottom and the side surface of the trench. Impurity region 3 is continuously formed to extend from the bottom surface of the trench to the upper surface of epitaxial layer 2. The bottom surface of the trench is used as a light-receiving surface for signal light. The surface impurity concentration and the semiconductor junction depth of impurity region 3 are optimized for good response to the wavelength of the signal light. For example, if the signal light has a wavelength of 0.4 μm, preferably impurity region 3 has, at the bottom surface of the trench, a surface impurity concentration of $10^{17}$ to $10^{20}$ cm$^{-3}$ and a junction depth of 1 μm or less.

When impurity region 3 of p type is formed at the surface of n type silicon substrate exposed at the bottom of the trench, for example, a silicon oxide film of 10 to 20 nm in thickness is formed on the inner wall of the trench and the upper surface of epitaxial layer 2 through a conventional technique. Subsequently, by means of the photolithography technique, the inner wall of the trench is entirely implanted with boron ions. The acceleration energy and dose of the ions at this time are respectively 15 to 40 keV and $1 \times 10^{13}$ to $10^{15}$ cm$^{-2}$. Instead of boron ions, group III element-containing compound ions such as boron difluoride ions may be used as the implantation species. If the boron difluoride ions are used, the acceleration energy may be 20 to 50 keV.

In making metal electrode interconnection, a part of impurity region 3 that is in contact with the metal should have an impurity concentration of at least $10^{20}$ cm$^{-3}$ for producing an ohmic contact. If the part of impurity region 3 to be in contact with the metal interconnect has an impurity concentration of less than $10^{20}$ cm$^{-3}$, additional ions should be implanted in the part. In such a case, dose may be $3 \times 10^{15}$ to $1 \times 10^{16}$ cm$^{-2}$.

If the taper angle θ of the trench sidewall indicated by FIG. 2B is relatively large, ion implantation into the trench side surface can be insufficient so that impurity region 3 does not have a desired impurity concentration at the trench side surface. In such a case, the ion implantation may be performed at an angle of inclination of 30 to 60° to give a desired impurity concentration to the trench side surface of impurity region 3.

Annealing at 900° C. for 30 to 70 minutes for example is then carried out, so that the crystal distortion due to the ion implantation is decreased and the distribution of the impurity concentration is adjusted to make impurity region 3 completed. Through the process as described above, impurity region 3 is formed to have at the bottom surface of the trench a surface impurity concentration of $10^{18}$ to $10^{20}$ cm$^{-3}$ and a junction depth of 0.4 to 1.0 μm.

Impurity region 3 may alternatively be formed by the method described below. A silicon oxide film is formed on the entire surface of epitaxial layer 2 by treatment under oxidizing atmosphere, and the resultant silicon oxide film is selectively removed at the portion where impurity region 3 should be formed by means of photolithography and etching, so that an opening is made in the oxide film. Then, a BSG (boron-doped-silicated-glass) film for example is deposited on the entire surface, and subsequent annealing performed at 1050° C. for 10 to 20 seconds for solid phase diffusion produces p-type impurity region 3 having a surface impurity concentration of $10^{18}$ to $10^{20}$ cm$^{-3}$ and a junction depth of 0.06 to 0.20 μm. If impurity region 3 is formed by such solid phase diffusion, the impurity region can be formed on the trench side surface without influence of the taper angle θ of the trench. Moreover, lattice defects due to ion implantation damage do not occur. The solid phase diffusion would thus be more preferable for achieving a photodetector element with a higher sensitivity.

Figure 2D:
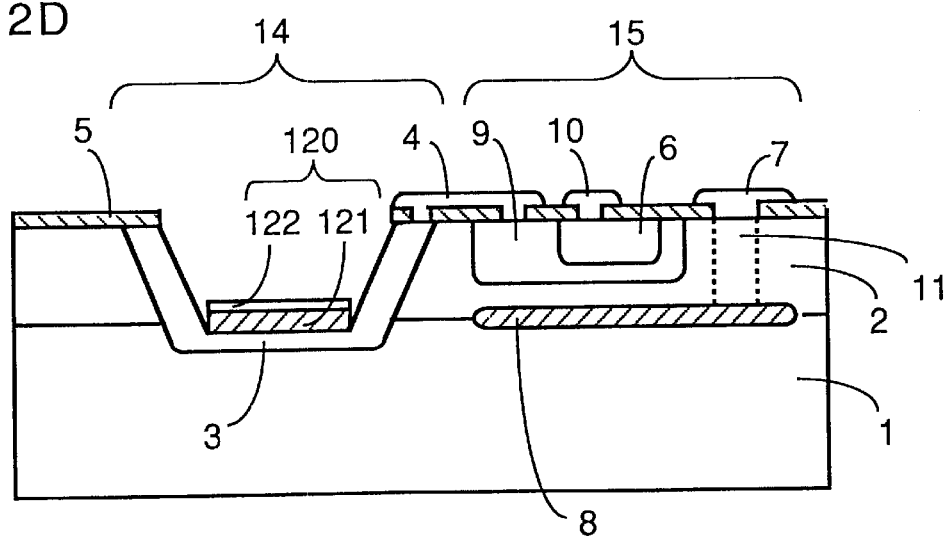

After impurity region 3 is formed, silicon oxide film 121 is formed on the surface of the photodetector element region by annealing under oxidizing atmosphere as shown in FIG. 2D. Silicon nitride film 122 is further formed on silicon oxide film 121 by CVD or the like.

After this, by means of a conventional technique, are formed interlayer insulating film 5, metal electrode interconnect 4 electrically coupled to impurity region 3 of the photodetector element, and signal processing circuit (including a transistor for example) 15 for processing a photoelectrically converted signal from the photodetector element.

The circuit-containing photodetector as shown in FIG. 1 is produced through the process described above. It is noted that the step of forming circuit 15 (including a transistor for example) for processing a photoelectrically converted signal from photodetector element 14 may be done prior to or in parallel with the step of forming the photodetector element portion.

Example 3

FIGS. 3A to 3D schematically show another process of manufacturing the circuit-containing photodetector as shown in FIG. 1. In this process, an impurity region is first formed in such a manner that at least a part of the impurity region overlaps the region where the trench is to be formed. Then, the trench is made by etching such that the part of the impurity region constitutes the photodetector element impurity region and the conductive impurity region for signal transmission.

Figure 3:
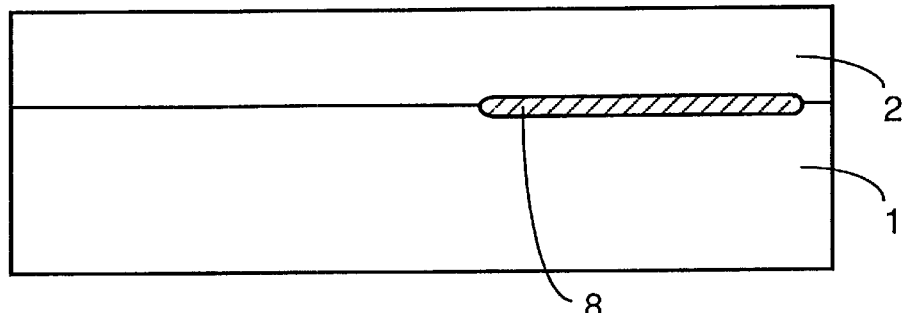
FIGS. 3A to 3D are cross sectional views schematically showing another method of manufacturing the circuit-containing photodetector shown in FIG. 1.
Figure 3:
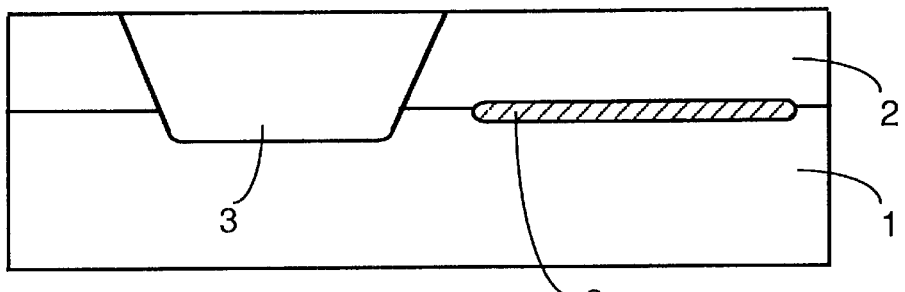
Figure 3:
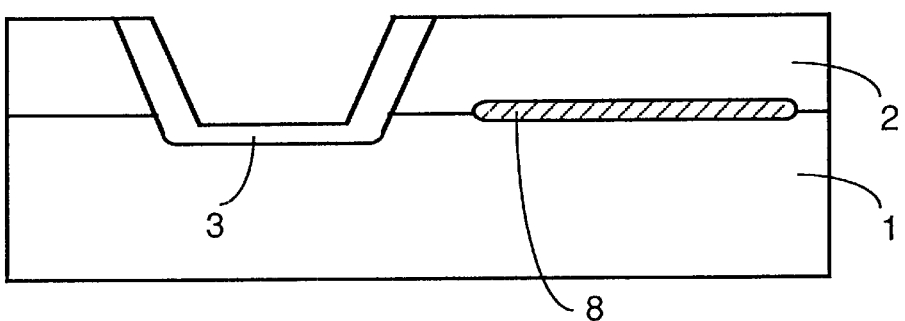
Figure 3:
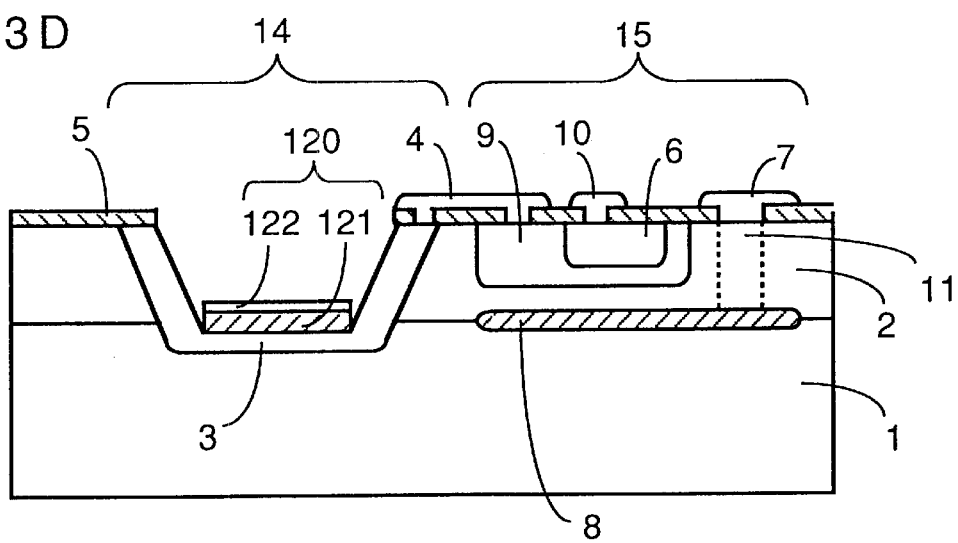

Regarding this process, the step of FIG. 3A corresponds to that of FIG. 2A. However, in the step of FIG. 3B, impurity region 3 which has a conductivity type opposite to that of silicon substrate 1 and has a depth to reach silicon substrate 1 is formed by using a conventional photolithography technique, and ion implantation and annealing or solid phase diffusion.

Referring to FIG. 3C, photolithography and etching techniques are used to form a trench in such a manner that a bottom portion and at least a part of the side portion of impurity region 3 are left. The part of impurity region 3 left at the bottom surface of the trench after etching serves a function of the photodetector element. An appropriate depth of impurity region 3 as well as an appropriate depth of the trench formed by etching is selected in order to produce a photodetector element having a desired semiconductor junction depth. If incident signal light has a short wavelength, the junction depth can be made small so that the photodetector element has suitable optical sensitivity characteristics for the signal light wavelength. For example, if the signal light has a wavelength of 0.4 μm as described above, impurity region 3 should have, at the trench bottom surface, a surface impurity concentration of $10^{17}$ to $10^{20}$ cm$^{-3}$ and a junction depth of 1 μm or smaller. For example, these values can be achieved as described below, when a p-type impurity region is formed in an n-type silicon substrate by ion implantation.

An oxide film of 10 to 20 nm in thickness is formed on the entire surface of epitaxial layer 2 by a conventional technique, and photolithography technique is then used to implant boron ions into the portion where the photodetector element is to be formed. The acceleration energy and dose of boron ions at this time are respectively 20 to 60 keV and $1\times10^{15}$ to $1\times10^{16}$ cm$^{-2}$. As mentioned above, instead of boron ions, group III element-containing compound ions such as boron difluoride ions may be used as the implantation species. If the boron difluoride ions are used, the acceleration energy thereof may be 40 to 90 keV.

Impurity region 3 has a part that is in contact with metal interconnect 4. Such a part should have an impurity concentration of $10^{20}$ cm$^{-3}$ or higher for producing an ohmic contact. If the impurity concentration is insufficient, additional ions may be implanted into the part with a dose of $3\times10^{15}$ to $1\times10^{16}$ cm$^{-3}$. Annealing at 1000° C. for 2 to 3 hours for example is then carried out to form impurity region 3.

Referring to FIG. 3C, the trench passing through the thickness of epitaxial layer 2 is then formed by etching so that impurity region 3 with a surface impurity concentration of $10^{17}$ to $10^{19}$ cm$^{-3}$ and a junction depth of 0.6 to 1.0 μm is formed at the bottom surface of the trench.

As shown in FIG. 3D, the circuit-containing photodetector having a structure as shown in FIG. 1 is completed through a process similar to that of Example 2.

In general, annealing is performed after the ion implantation for repairing crystal defects. The annealing should be performed to a sufficient extent, because the density of defects considerably affects the sensitivity of the photodetector element. If the annealing time is so long that the semiconductor junction depth becomes too great, a high optical sensitivity cannot be obtained with respect to the light of a short wavelength as discussed above.

On the other hand, in the process as illustrated in FIGS. 3A to 3D, the annealing after the ion implantation is sufficiently carried out to repair crystal defects and then a desired junction depth can be obtained in the process of making the trench by etching. Accordingly, the photodetector element portion has a remarkably low density of defects in impurity region 3 as well as a small junction depth. The resulting photodetector element can thus have a high sensitivity with respect the light of a short wavelength.

Example 4

FIGS. 4A to 4D schematically show still another process of the circuit-containing photodetector having a structure as shown in FIG. 1. In the process, an impurity region is so formed that at least a part of the impurity region overlaps the region where the trench is to be formed. Then, the trench is formed by etching in such a manner that at least a part of the side surface of the trench forms the conductive impurity region for signal transmission. The bottom portion of the trench is then doped with impurities to produce the photodetector element.

Figure 4:
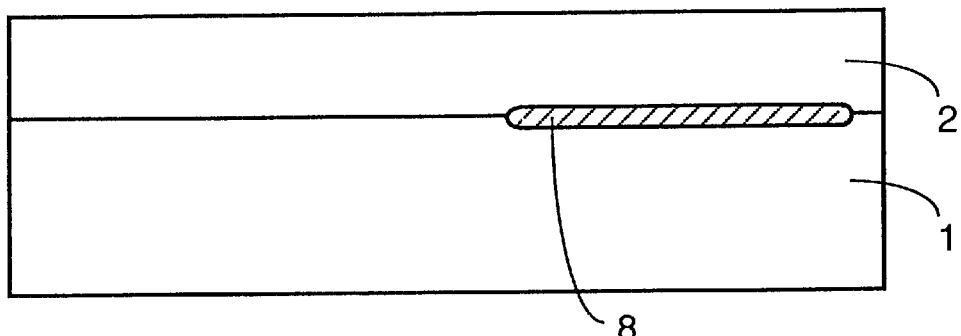
FIGS. 4A to 4D are cross sectional views schematically showing still another method of manufacturing the circuit-containing photodetector shown in FIG. 1.
Figure 4:
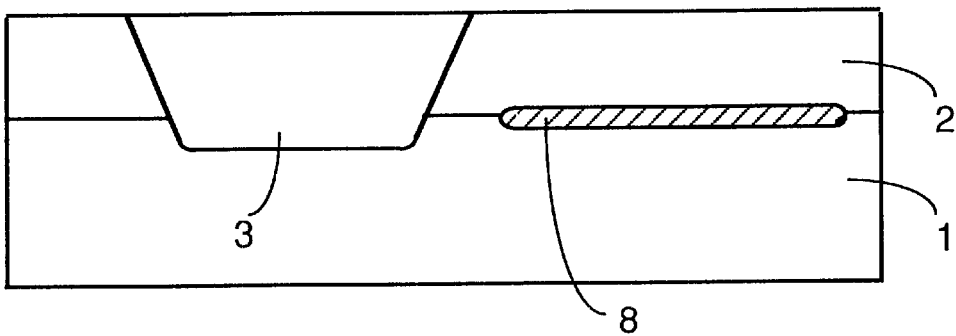
Figure 4:
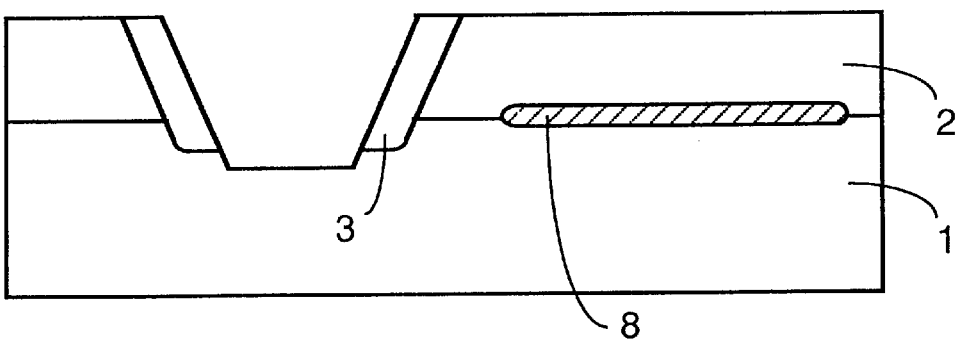
Figure 4:
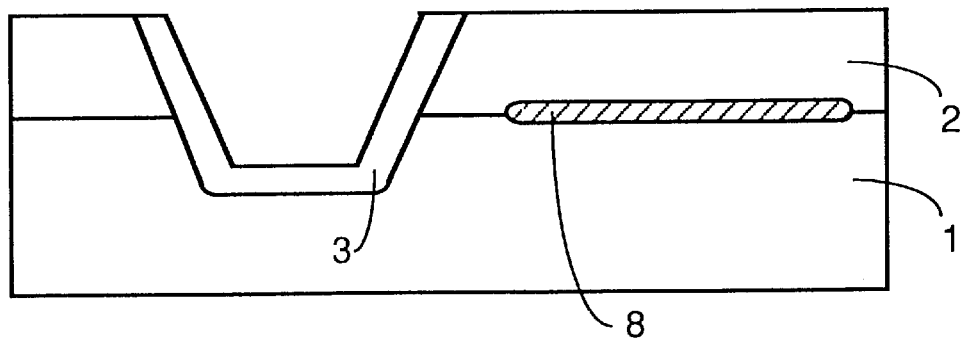

Regarding the process, the steps shown in FIGS. 4A and 4B are similar to those in FIGS. 3A and 3B. However, the step shown in FIG. 4C forms the trench deeper than the depth of impurity region 3 formed by the ion implantation. Referring to FIG. 4D, ion implantation and annealing, or solid phase diffusion or the like is used to newly form an impurity region 3 of the same conductivity type at the trench bottom portion. The newly formed impurity region is connected to trench side impurity region 3.

In this process, the junction depth of the resulting photodetector element is not affected by variation in etching rate of the trench-forming step, as compared with the process as shown in FIGS. 3A to 3D. When the etching rate varies widely, the process shown in FIGS. 4A to 4D are more preferable than that in FIGS. 3A to 3D. Additionally, in the process as shown in FIGS. 4A to 4D, the impurity concentration and junction depth in the trench bottom surface portion of impurity region 3 can be adjusted independently of those in the trench side surface portion thereof. The step shown in FIG. 4D and the subsequent steps are similar to those as illustrated in FIG. 3D.

Example 5

Figure 5:
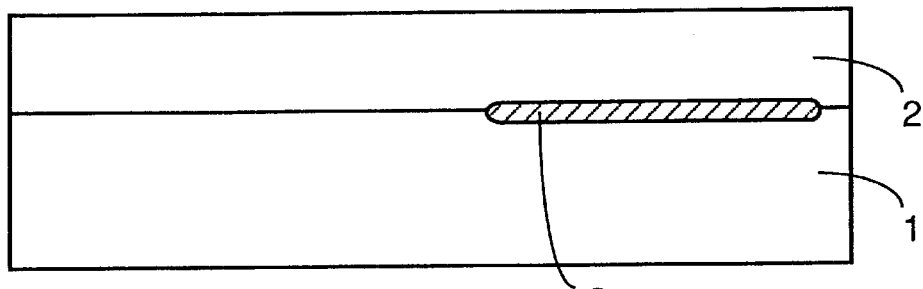
FIGS. 5A to 5D are cross sectional views schematically showing a method of manufacturing a circuit-containing photodetector in another example of the present invention.
Figure 5:
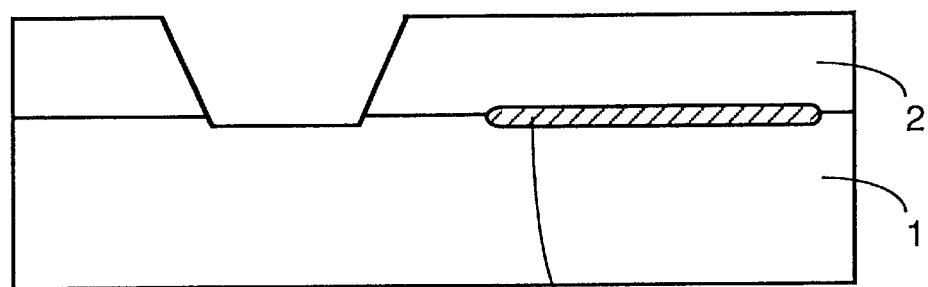
Figure 5:
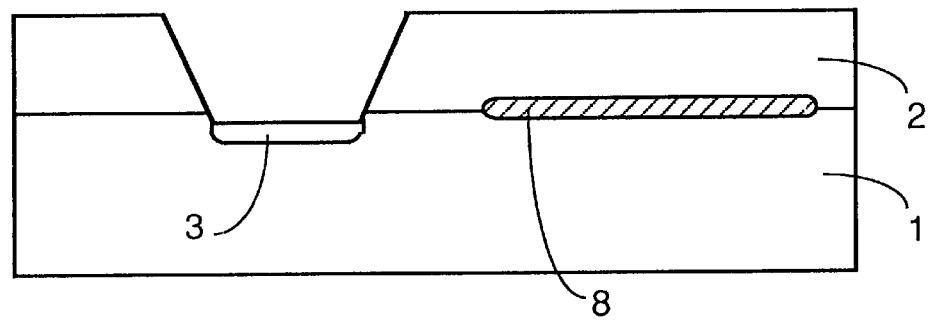
Figure 5:
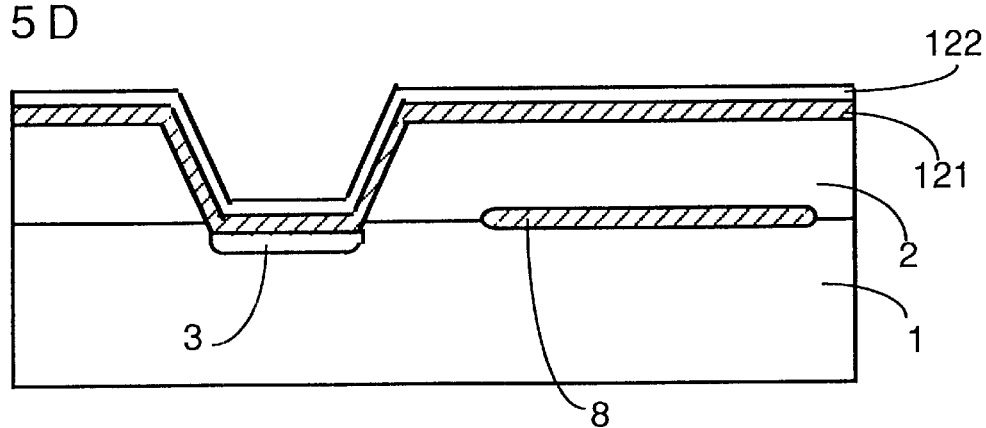

Referring to schematic cross sections shown in FIGS. 5A to 5D and 6A to 6C, another structure and method are described. The process as shown in FIGS. 5A and 5B are similar to that in FIGS. 2A and 2B.

The step in FIG. 5C uses a conventional photolithography and ion implantation and annealing, or solid phase diffusion or the like to form an impurity region 3 at the bottom portion of the trench. This impurity region 3 may be formed at least at the bottom portion of the trench and there is no need to form the impurity region at the side surface of the trench. As described in the above, the surface impurity concentration and the semiconductor junction depth in the trench bottom portion of impurity region 3 are optimized for good response to the wavelength of the signal light.

Referring to FIG. 5D, annealing under oxidizing atmosphere forms a silicon oxide film 121, and a silicon nitride film 122 is further formed thereon by CVD or the like.

Figure 6A:
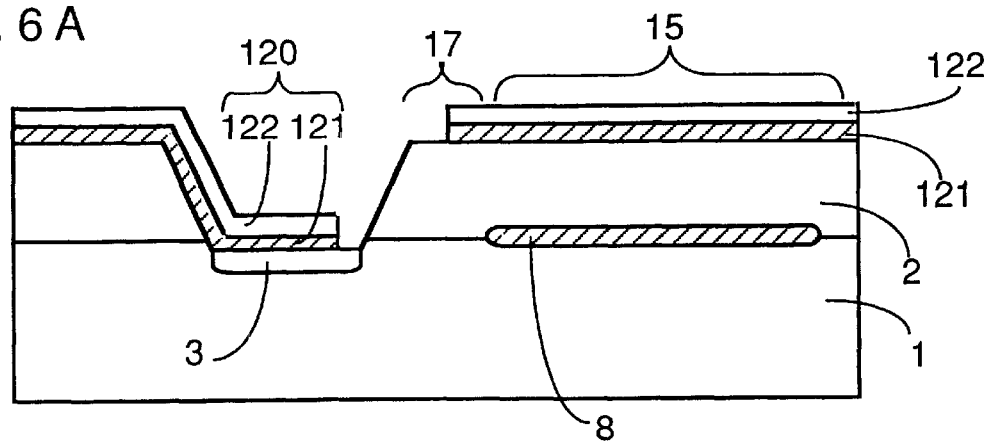
FIGS. 6A to 6C are cross sectional views schematically showing a manufacturing process after the process shown in FIGS. 5A to 5D.

Referring to FIG. 6A, at the part of the region extending from one end of the trench bottom surface to the upper surface of epitaxial layer 2, silicon oxide film 121 and silicon nitride film 122 are removed by conventional photolithography and etching techniques. On the upper surface of epitaxial layer 2, any part of the oxide and silicon nitride films may be removed insofar as the removed part is in the range from one end of the trench structure to signal processing circuit 15. In this case, the range 17 is several tens μm in length, which provides a sufficiently large margin for the etching process. Accordingly, when region 17 for etching is made by means of photolithography, the light may be focused on the bottom surface of the trench. Even if the upper surface of epitaxial layer 2 is slightly out of focus, no problem arises.

After the etching step, silicon oxide film 121 and silicon nitride film 122 remaining at the trench bottom surface form an antireflection film 120 for a photodetector element.

Figure 6B:
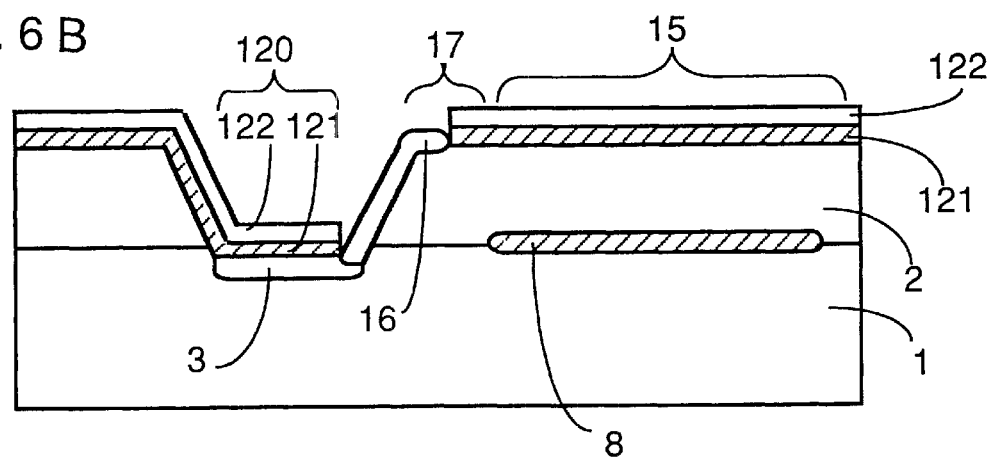

Referring to FIG. 6B, titanium is sputtered onto the entire surface of wafer and heat-treated at 600 to 700° C. for 10 to 20 seconds. By the heat treatment, a titanium silicide film 16 is formed only in the region 17 where oxide film 121 and nitride film 122 are eliminated. If desired for producing a complete titanium silicide film 16, additional heat treatment may be performed at 800 to 1000° C. for 10 seconds. Then, only the titanium left on nitride film 122 is selectively removed by sulfuric acid treatment.

A part of impurity region 3 that is in contact with silicide film 16 should have an impurity concentration of at least $10^{20}$ cm$^{-3}$ for producing an ohmic contact. Accordingly, if the impurity concentration of that part is less than $10^{20}$ cm$^{-3}$, additional ions should be implanted into that contact part before the titanium is sputtered. Dose at this time may be $3\times10^{15}$ to $1\times10^{16}$ cm$^{-2}$.

Through these steps, titanium silicide film 16 is formed to extend from one end of the trench bottom surface to the upper surface of epitaxial layer 2. A metal electrode interconnect 4 may only be formed on the upper surface of epitaxial layer 2, because it can be electrically connected to impurity region 3 via silicide film 16. When the pattern of metal electrode interconnect 4 is formed by means of photolithography, therefore, the light may only be focused on the upper surface of epitaxial layer 2. The focusing is not influenced by the rising of the trench.

Moreover, titanium silicide film 16 generally has a lower electric resistance than a semiconductor impurity region. In this structure, therefore, the resistance of the conductive region at the trench side can be smaller than that of the circuit-containing photodetector as shown in FIG. 1. Accordingly, the silicide can provide a higher response speed for the photodetector element. In the Example, titanium may be replaced with other refractory metals such as cobalt and nickel to achieve similar effects.

Figure 6C:
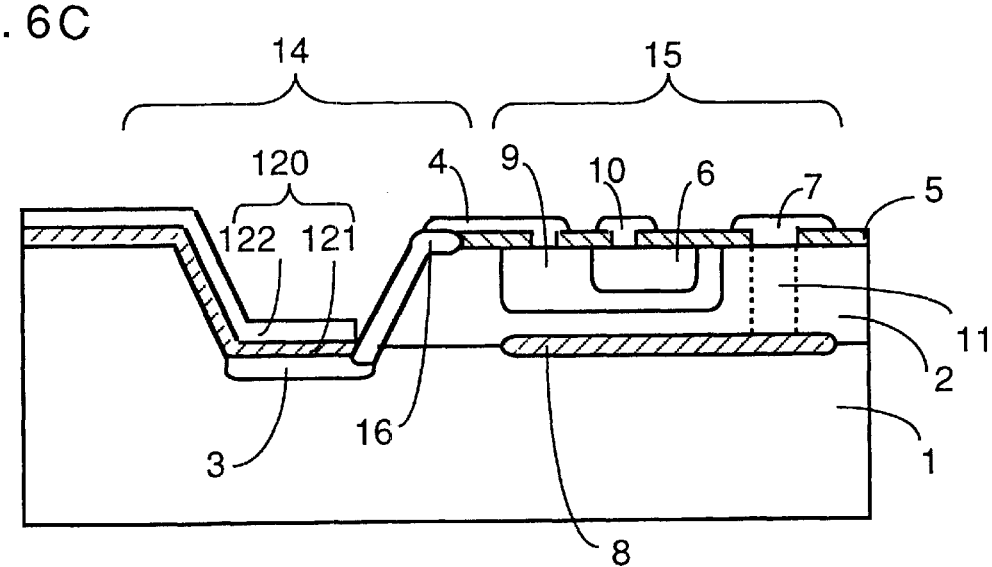

The step in FIG. 6C following FIG. 6B is similar to that of FIG. 2D.

Example 6

FIG. 7 shows a circuit-containing photodetector in this Example according to the present invention. Referring to FIG. 7, on a silicon substrate 1 having a specific resistance (e.g. 100–1000 Ωcm) and a thickness that are suitable for a photodetector element, is formed an epitaxial layer 2 having a specific resistance (e.g. 5 Ωcm) and a thickness (e.g. 2–3 μm) suitable for a circuit such as a transistor for processing a photoelectrically converted signal supplied from the photodetector element. Silicon substrate 1 and epitaxial layer 2 may have the same conductivity type, which may be either n or p.

A photodetector element portion 14 has a trench formed by means of etching to pass through the thickness of epitaxial layer 2. Silicon substrate 1 is partially exposed at the bottom surface of the trench. An impurity region 33 is formed at the bottom surface of the trench. Impurity region 33 has its conductivity type opposite to that of silicon substrate 1. Namely, if silicon substrate 1 is of p type, region 33 is of n type.

In the trench structure, the bottom surface portion is used as a light-receiving surface for signal light. In impurity region 33, the semiconductor junction depth of the impurities at the bottom surface portion of the trench is optimized depending on the wavelength of the signal light so as to obtain a high optical sensitivity. For example, if the signal light has a wavelength of 0.4 μm, preferably the impurity concentration is approximately $1\times10^{17}$ to $1\times10^{20}$ cm$^{-3}$ and the junction depth is 1 μm or less.

An impurity region 36 in contact with impurity region 33 is formed at a boundary region between silicon substrate 1 and epitaxial layer 2. Impurity region 36 is typically present at the surface of silicon substrate 1 and the bottom part of epitaxial layer 2. Impurity region 36 is electrically conductive. The impurity concentration of region 36 may be in such a range that region 36 can be electrically conductive, and typically such a concentration is about $1 \times 10^{17}$ cm$^{-3}$ or higher. There is no particular limitation regarding the junction depth of impurity region 36.

An impurity region 37 is further formed in epitaxial layer 2 to extend from the upper surface of epitaxial layer 2 to impurity region 36. Region 37 is in contact with at least impurity region 36. Impurity region 37 is also electrically conductive. The impurity concentration of region 37 may also be in such a range that region 36 can be electrically conductive, and typically such a concentration is about $1 \times 10^{17}$ cm$^{-3}$ or higher. Moreover, impurity region 37 may include a part which is in contact with a metal electrode interconnect 4 and which preferably has an impurity concentration of at least $1 \times 10^{20}$ cm$^{-3}$ for generating an ohmic contact.

On the bottom surface of the trench forming a light-receiving region, are stacked a silicon oxide film 121 and a silicon nitride film 122 having uniform thicknesses respectively. The stacked films function as an antireflection film 120 at the light-receiving surface. Therefore, respective thicknesses of silicon oxide film 121 and silicon nitride film 122 are so selected that an effective antireflection function can be achieved for the wavelength of the signal light employed. For example, if the signal light used for an optical pickup has a wavelength of 0.4 µm, a surface reflectance of 1% or lower can be obtained by setting thicknesses of the silicon oxide film and the silicon nitride film at 20 nm and 30 nm respectively.

A signal processing circuit (including a transistor for example) that processes a photoelectrically converted signal supplied from photodetector element 14 is formed on epitaxial layer 2 by means of a conventional technique similar to that shown in FIG. 20C. The technique is described above and therefore is not repeated here.

Regarding the conventional circuit-containing photodetector as shown in FIG. 20C, metal electrode interconnect 4 must be formed from the trench bottom portion to the upper surface of epitaxial layer 2. On the other hand, the circuit-containing photodetector as shown in FIG. 7 has conductive impurity region 36 at the boundary between silicon substrate 1 and epitaxial layer 2 and conductive impurity region 37 is further formed to be in contact with impurity region 36. In the device as shown in FIG. 7, metal interconnect 4 may only be provided at the upper surface region of epitaxial layer 2. Therefore, when a pattern of metal electrode interconnect 4 is made according to the present invention, the light for photolithography may only be focused on the upper surface of epitaxial layer 2 regardless of the rising of the trench structure. In this way, it is possible to remarkably reduce deterioration of metal electrode interconnect 4 such as breaking.

Example 7

FIG. 8 shows a circuit-containing photodetector in Example 7 according to the present invention. The device shown in FIG. 8 includes an impurity region 46 in contact with an impurity region 33 of a photodetector element 14. Region 46 serves to transmit a signal and also serves as an n-type buried diffusion layer for a signal processing circuit portion 15. Impurity region 46 is formed at a boundary portion between a substrate 1 and an epitaxial layer 2. Impurity region 46 is in contact with an impurity region 37, which is electrically conductive for transmitting a signal and in contact with a collector compensation region 11 for circuit portion 15. The device shown in FIG. 8 is similar in structure to the device shown in FIG. 7 except for impurity region 46.

Example 8

Figure 9:
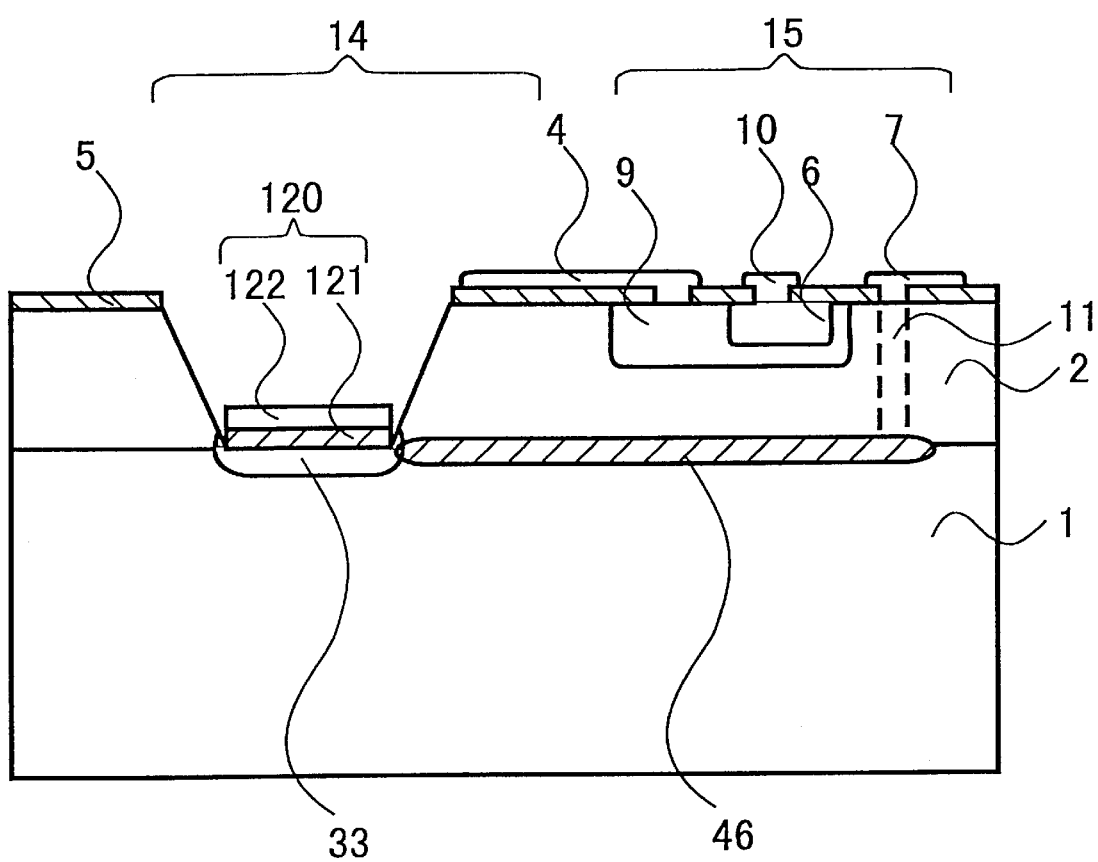
FIG. 9 is a cross sectional view schematically showing a circuit-containing photodetector in Example 8 according to the present invention.

FIG. 9 shows a circuit-containing photodetector in Example 8 according to the present invention. The device shown in FIG. 9 also includes an impurity region 46 in contact with an impurity region 33 of a photodetector element 14. Region 46 serves to transmit a signal and also serves as an n-type buried diffusion layer for a signal processing circuit portion 15. Impurity region 46 is in contact with a collector compensation region 11 for circuit portion 15. Collector compensation region 11 reaches the upper surface of an epitaxial layer 2 and it also serves to transmit a signal insofar as it does not interfere with the function of the circuit. Namely, region 11 has both functions of collector compensation and signal transmission. The device shown in FIG. 9 is similar in structure to that in FIG. 8 except for collector compensation region 11.

Example 9

Figure 10:
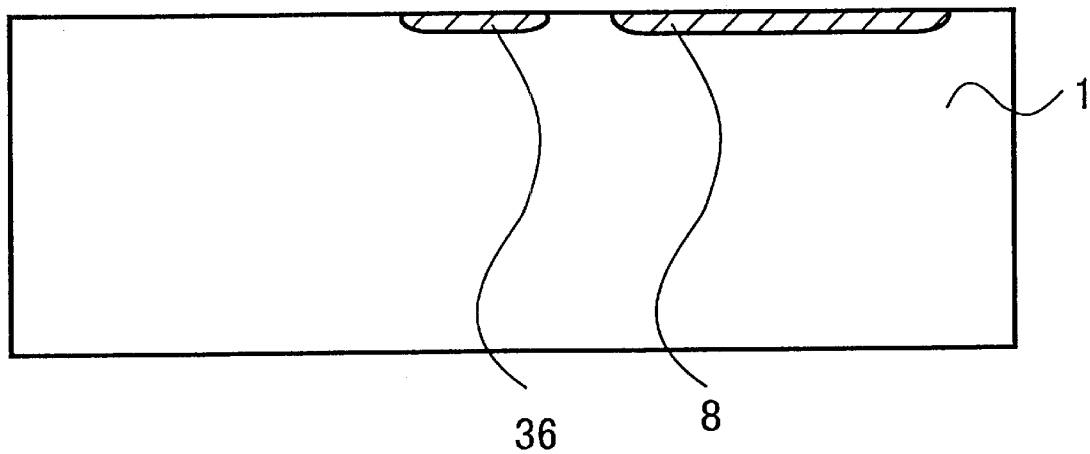
FIGS. 10 to 13 are cross sectional views schematically showing a method of manufacturing the circuit-containing photodetector shown in FIG. 7.

The circuit-containing photodetector as shown in FIG. 7 is manufactured by the process as shown in FIGS. 10 to 13. Referring to FIG. 10, conductive impurity region 36 for signal transmission is formed in silicon substrate 1, which has a specific resistance (e.g. 100–300 Ωcm) and a thickness that are suitable for the photodetector element and has buried diffusion layer 8 (e.g. n type) formed therein. Region 36 is formed by means of a conventional photolithography technique, and ion implantation and annealing, or solid phase diffusion or the like. In the process of forming region 36, for example, an oxide film with a thickness of 10 to 20 nm is formed by a conventional technique, and the oxide film is then patterned by means of photolithography. The patterned oxide film is used as an implantation protection film, and typically boron ions are implanted with an acceleration energy of 15 to 60 keV and a dose of $1 \times 10^{14}$ to $1 \times 10^{16}$ cm$^{-2}$ for low resistance. Alternatively, buried diffusion layer 8 and region 36 may be formed simultaneously. In such a case, the number of the manufacturing steps and the production cost can be reduced.

Figure 11:
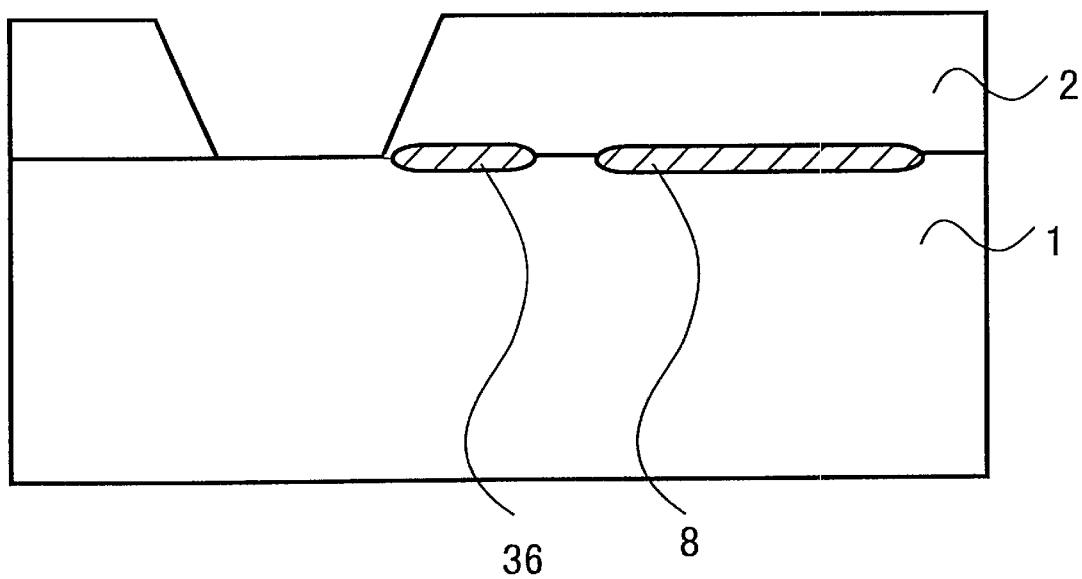

Then, a conventional process is used to grow epitaxial layer 2, which has a specific resistance (e.g. 5 Ωcm) and a thickness (e.g. 2–3 µm) that are suitable for a circuit (e.g. transistor) for processing a photoelectrically converted signal from the photodetector element. The conductivity type of silicon substrate 1 and epitaxial layer 2 may be either n or p type. After the growth of epitaxial layer 2, as shown in FIG. 11, a conventional photolithography and etching techniques are used to remove a part of epitaxial layer 2 for the formation of the photodetector element, so that the trench structure is formed on substrate 1 which is partially exposed.

Figure 12:
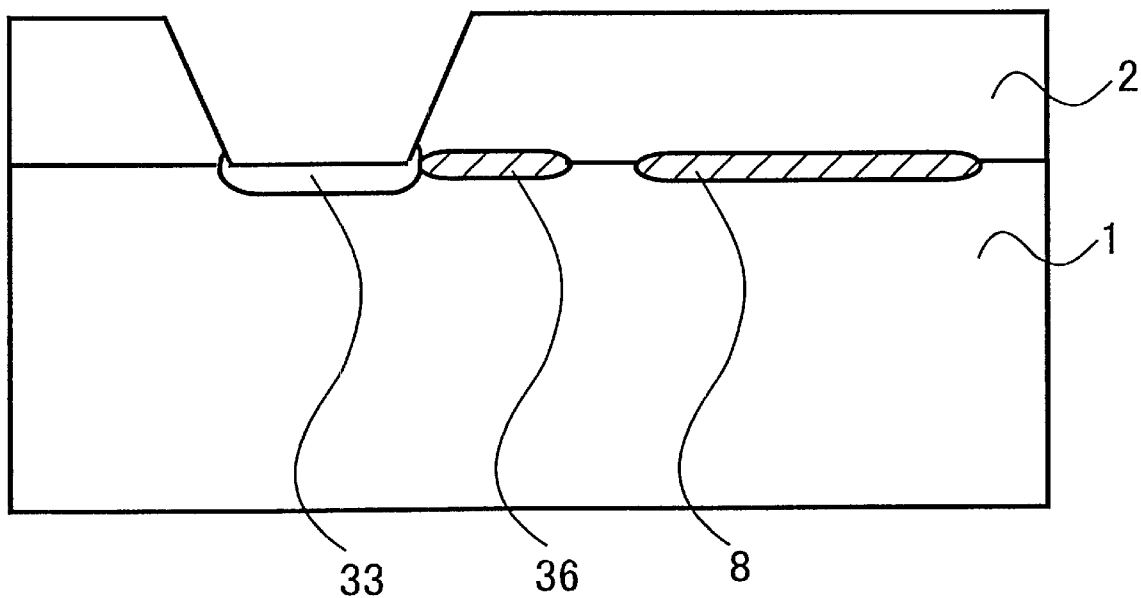

Referring to FIG. 12, impurity region 33 is formed by means of a conventional photolithography technique, and ion implantation and annealing, or solid phase diffusion or the like. Impurity region 33 is formed to have at least a part in contact with conductive impurity region 36 for signal transmission.

The bottom surface portion of the trench provides a light-receiving surface for signal light. The surface concentration and the junction depth of impurity region 33 are preferably optimized depending on the wavelength of the signal light employed. For example, if the signal light has a wavelength of 0.4 μm, preferably the surface concentration and the junction depth of impurity region 33 are set respectively at $10^{17}$ to $10^{20}$ cm$^{-3}$ and 1 μm or less.

Typically, p-type impurity region 33 having a surface concentration and a junction depth set as mentioned above is formed through ion implantation and annealing in the following manner. An oxide film of 10 to 20 nm in thickness is formed by a conventional technique. Then, the oxide film is patterned by photolithography to form an implantation protection film. Boron ions for example are then implanted into the bottom surface portion of the trench. The acceleration energy and dose for the ion implantation are typically 15 to 40 keV and $1 \times 10^{13}$ to $1 \times 10^{15}$ cm$^{-2}$ respectively. Here, instead of boron ions, group III element-containing species such as boron difluoride ions may be used for the implantation. If the boron difluoride ions are employed, the acceleration energy may be 20 to 50 keV. Then, annealing at 900° C. for 30 to 70 minutes for example is performed to form impurity region 33. Through the steps described above, the impurity region is formed at the trench bottom to have a surface concentration of $10^{18}$ to $10^{20}$ cm$^{-3}$ and a junction depth of 0.4 to 1.0 μm.

The method as described below may alternatively be employed to form impurity region 33. A silicon oxide film is formed on the entire surface of the substrate by treatment under oxidizing atmosphere. Conventional photolithography and oxide film etching techniques are used to partially remove the silicon oxide film at the portion where impurity region 33 will be formed, so that an opening is made in the oxide film. Then, a BSG (boron-doped-silicated-glass) film for example is deposited, and then heat-treated at 1050° C. for 10 to 20 seconds for solid phase diffusion. Through the process, is produced p-type impurity region 33 having a surface concentration of $10^{18}$ to $10^{20}$ cm$^{-3}$ and a junction depth of 0.06 to 0.20 μm. In the case that impurity region 33 is formed by solid phase diffusion, crystal defects are not so generated as in the ion implantation. The solid phase diffusion would be more preferable for obtaining a photodetector element with a higher sensitivity.

Boron ions for example are then implanted into the surface of epitaxial layer 2 to generate impurity region 37. The acceleration energy and dose of the ions at this time are respectively 40 to 80 keV and $1 \times 10^{14}$ to $1 \times 10^{16}$ cm$^{-2}$. Instead of boron ions, group III element-containing species such as boron difluoride ions may be used for the implantation. If the boron difluoride ions are used, the acceleration energy may be 60 to 120 keV. Annealing at 900° C. for 30 to 70 minutes for example is then performed to give impurity region 37 with a surface concentration of $10^{18}$ to $10^{20}$ cm$^{-3}$. The above process results in a contact structure of the conductive impurity region for signal transmission.

For ohmic contact between the electrode interconnection and the impurity region, a part of impurity region 37 in contact with the metal interconnect should have an impurity concentration of at least $10^{20}$ cm$^{-3}$. If that part has an impurity concentration of less than $10^{20}$ cm$^{-3}$, additional ions may be implanted into the surface portion that will be in contact with metal.

Figure 13:
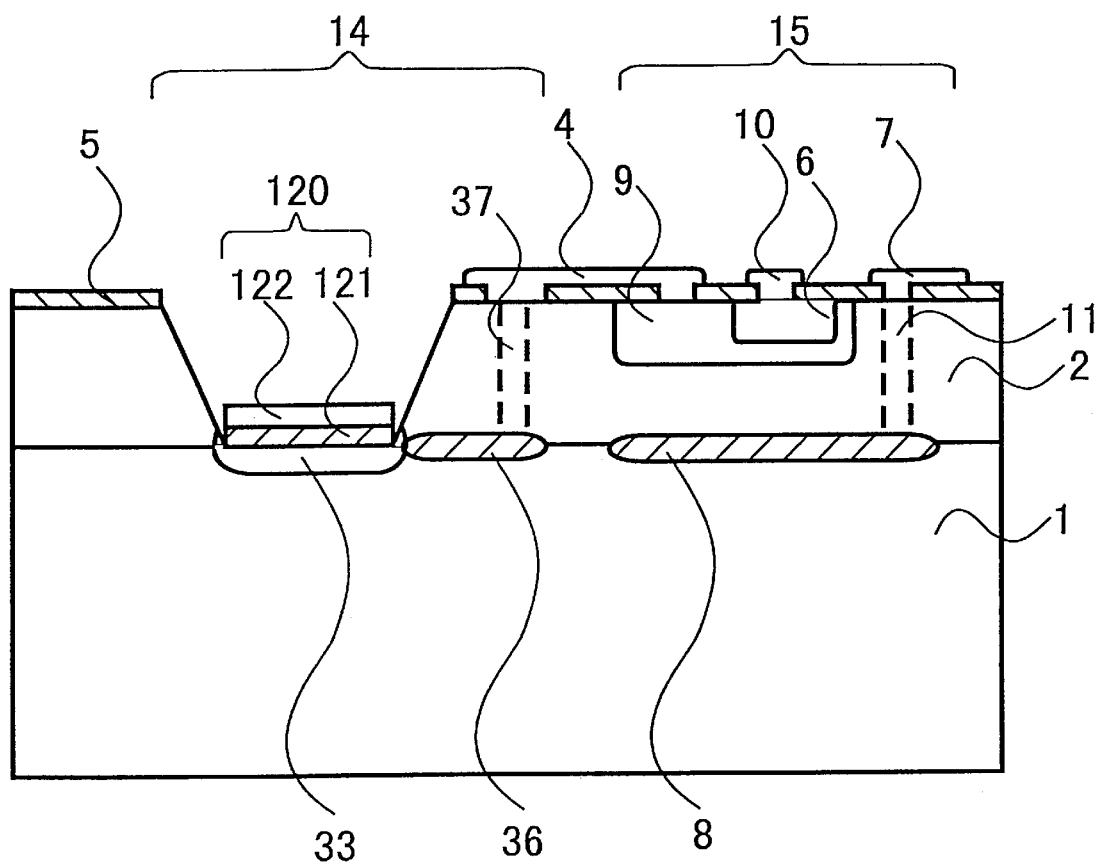

Referring to FIG. 13, silicon oxide film 121 is formed on the photodetector element region by heat treatment under oxidizing atmosphere. Silicon nitride film 122 is then formed on silicon oxide film 121 by CVD or the like. A conventional technique is then used to form interlayer insulating film 5, metal electrode interconnect 4 for photodetector element 14, and a circuit (a transistor for example) for processing a photoelectrically converted signal supplied from the photodetector element.

The above process results in the circuit-containing photodetector as shown in FIG. 7. In the above process, the circuit should not always be formed after the light-receiving portion. The circuit may be formed prior to or in parallel with the light-receiving portion.

The above-described process does not need the formation of the electrode interconnect from the bottom of the trench. The electrode interconnect may only be formed on the surface of the epitaxial layer. When a pattern of the metal interconnection is made by means of photolithography, the light may be focused on the surface of the epitaxial layer regardless of the trench structure. According to the present invention, the manufacturing yield of the electrode interconnection can be improved.

Example 10

Figure 14:
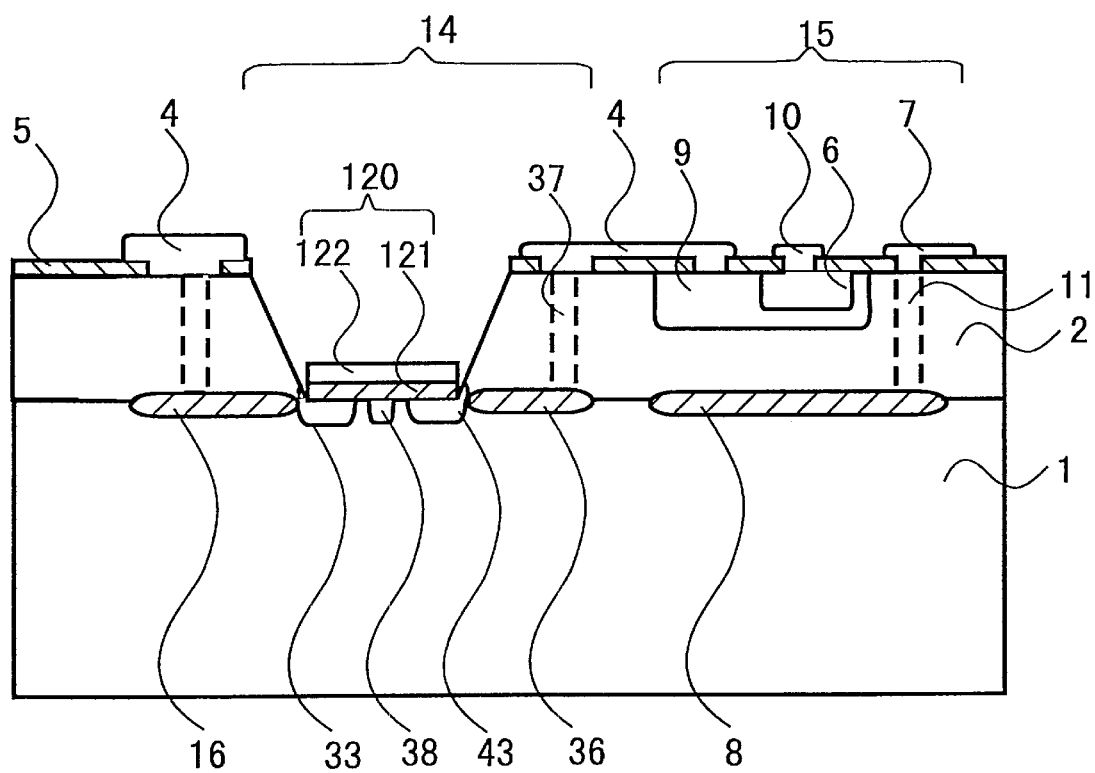
FIG. 14 is a cross sectional view schematically showing a split type circuit-containing photodetector in Example 10 according to the present invention.

According to the present invention, is provided a circuit-containing photodetector having the split structure of photodetector element as shown in FIG. 14. The split type photodetector element 14 includes a plurality of impurity regions 33 and 43. An isolation layer 38 is provided between the impurity regions 33 and 43. The conductivity type of isolation layer 38 is opposite to that of impurity regions 33 and 43 so as to prevent the surface inversion due to the charges accumulated in both of the oxide and nitride films constituting the antireflection film. The device as shown in FIG. 14 is similar in structure to that in FIG. 7 except for the split structure of the impurity regions.

Example 11

Figure 15:
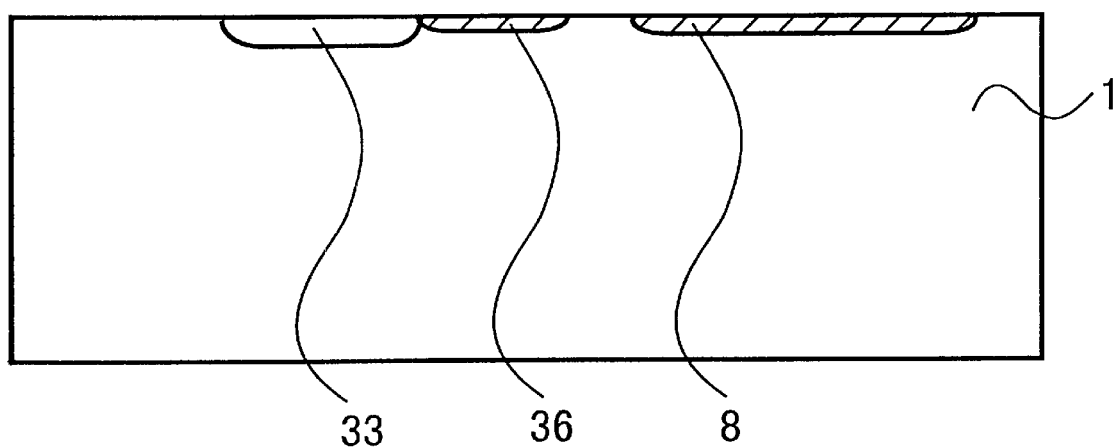
FIGS. 15 to 17 are cross sectional views schematically showing another method of manufacturing the circuit-containing photodetector shown in FIG. 7.
Figure 16:
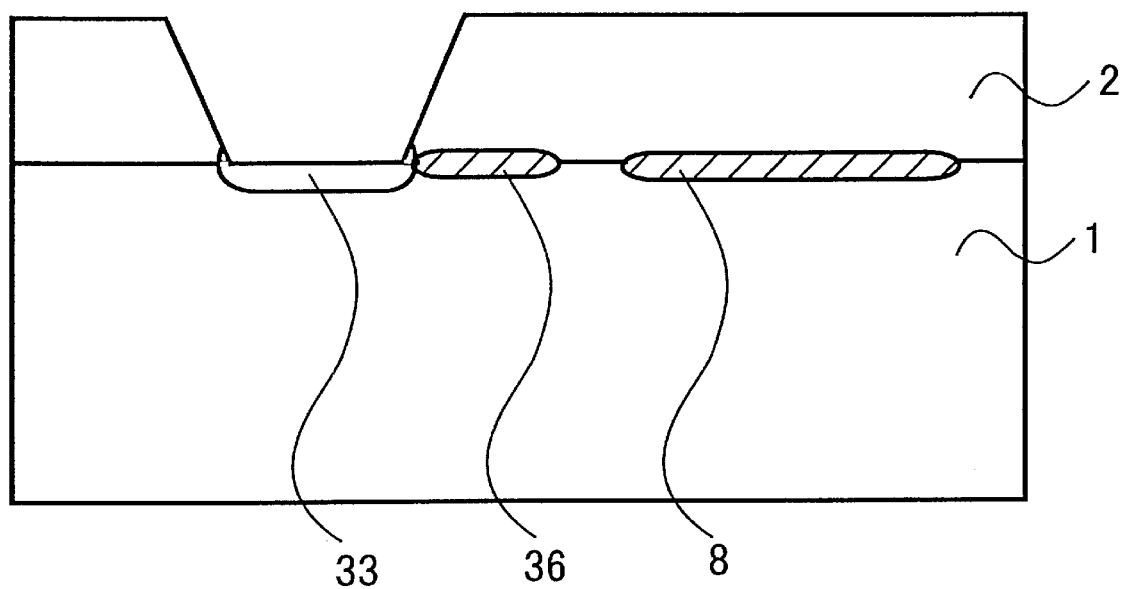
Figure 17:
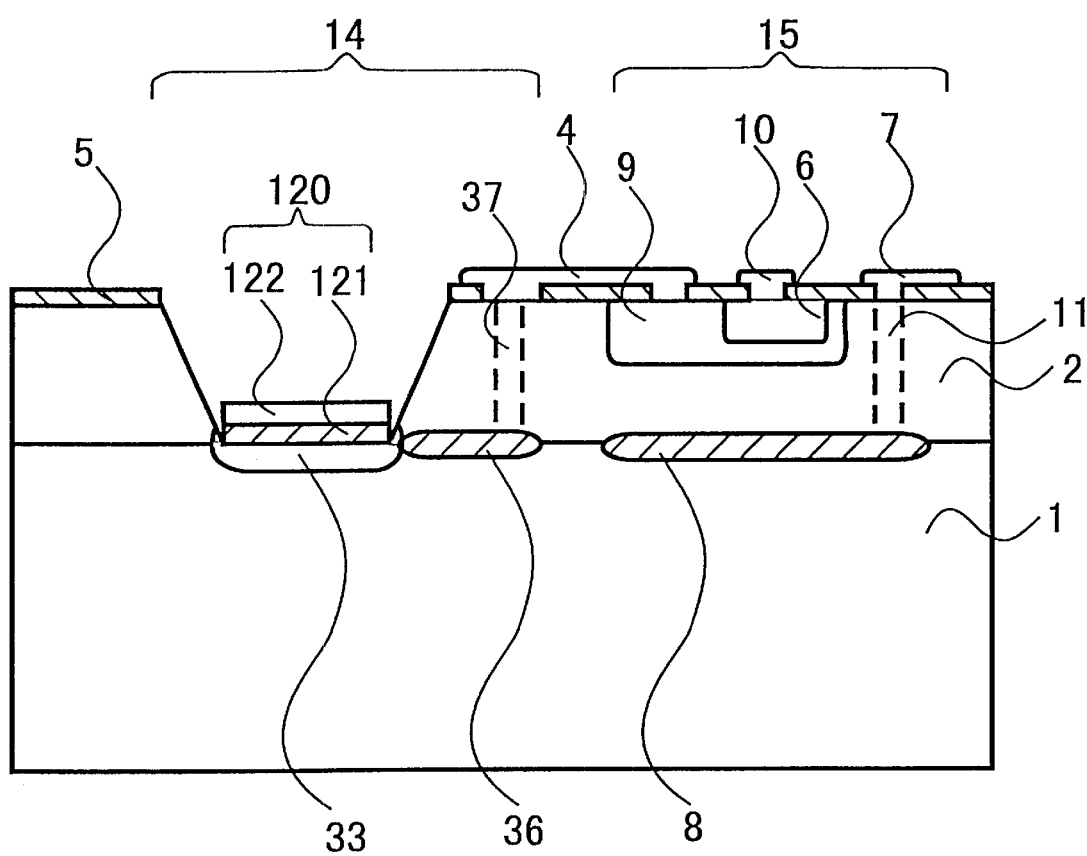

The circuit-containing photodetector as shown in FIG. 7 may also be manufactured through the process as shown in FIGS. 15 to 17. Referring to FIG. 15, a conventional photolithography technique, and ion implantation and annealing, or solid phase diffusion or the like are used to form conductive impurity region 36 for signal transmission and impurity region 33 for the photodetector element in silicon substrate 1, which has a specific resistance (e.g. 300 106 cm) and a thickness suitable for the photodetector element and has buried diffusion layer 8 (e.g. n type) formed therein. Impurity regions 33 and 36 are formed in contact with each other. Alternatively, buried diffusion layer 8 and region 36 may be formed in parallel. In such a case, the number of the manufacturing steps and the production cost can be reduced. In a typical process of conductive impurity region 36, an oxide film with a thickness of 10 to 20 nm is formed by a conventional technique and then patterned by means of photolithography to give an implantation protection film. Boron ions are then implanted with an acceleration energy of 15 to 60 keV and a dose of $1 \times 10^{14}$ to $1 \times 10^{16}$ cm$^{-2}$. In order to form impurity region 33, photolithography is also used to make a patterned oxide film as an implantation protection film, and boron ions for example are then implanted with an acceleration energy of 15 to 30 keV and a dose of $1 \times 10^{13}$ to $1 \times 10^{15}$ cm$^{-2}$. Alternatively, buried diffusion layer 8 and impurity region 33 may be formed in parallel. In such a case, the number of the manufacturing steps and the production cost can be reduced.

Then, a conventional process is used to grow epitaxial layer 2 having a specific resistance (e.g. 5 Ωcm) and a thickness (e.g. 2–3 μm) suitable for the circuit (e.g. transistor) for processing a photoelectrically converted signal from the photodetector element. The conductivity type of silicon substrate 1 and epitaxial layer 2 may be either n or p type. After the growth of epitaxial layer 2, as shown in FIG. 16, conventional photolithography and etching techniques are used to remove a part of epitaxial layer 2 for the formation of the photodetector element. The removed part reaches impurity region 33, so that substrate 1 is partially exposed to form the trench structure. The etching preferably reaches the position having a peak concentration of impurity region 33. If the peak concentration of impurity region 33 is located inside, the carriers generated on the surface might be accumulated due to the inner electric field caused by the distribution of the impurity concentration, so that the sensitivity and frequency characteristics might be degraded.

Boron ions for example are then implanted into the surface of epitaxial layer 2 to form impurity region 37. At this time, the acceleration energy is 40 to 80 keV and dose is $1\times10^{14}$ to $1\times10^{10}$ cm$^{-2}$. Here, instead of boron ions, other implantation species containing a group III element, such as boron difluoride ions, may be used. If the boron difluoride ions are employed, the acceleration energy may be 60 to 120 keV. Then, annealing at 900° C. for 30 to 70 minutes for example is performed to form impurity region 37 having a surface concentration of $10^{18}$ to $10^{20}$ cm$^{-3}$. Through the steps described above, the contact structure of the conductive impurity region for signal transmission is formed. For ohmic contact between the electrode interconnection and the impurity region, a part of impurity region 37 in contact with the metal interconnect should have an impurity concentration of at least $10^{20}$ cm$^{-3}$. If that part has an impurity concentration of less than $10^{20}$ cm$^{-3}$, additional ions may be implanted into the surface portion that will be in contact with metal.

Referring to FIG. 17, silicon oxide film 121 is formed on the photodetector element region by heat treatment under oxidizing atmosphere. Silicon nitride film 122 is further formed on silicon oxide film 121 by CVD or the like. A conventional technique is then used to form interlayer insulating film 5, metal electrode interconnect 4 for photodetector element 14, and a circuit (transistor for example) for processing a photoelectrically converted signal supplied from the photodetector element.

The circuit-containing photodetector as shown in FIG. 7 is produced through the process described above. In the above process, the circuit should not always formed after the light-receiving portion. The circuit may be formed prior to or in parallel with the light-receiving portion.

The above-described process does not require the formation of the electrode interconnect from the bottom of the trench. The electrode interconnect may only be formed at the surface of the epitaxial layer. When the pattern of the metal interconnection is made by means of photolithography, the light may just be focused on the surface of the epitaxial layer. In such a process, the step configuration of the trench does not influence the photolithography, so that a high production yield of the electrode interconnection can be achieved.

Example 12

Figure 18:
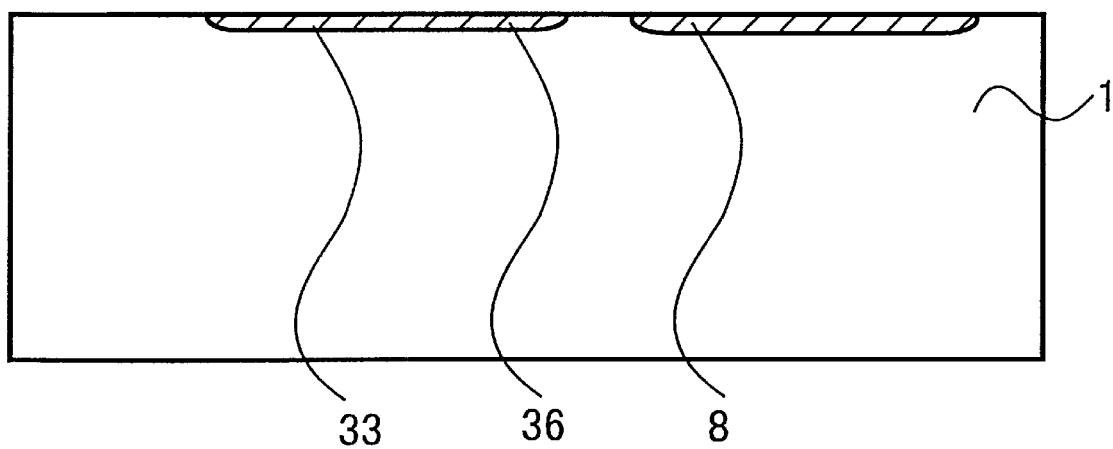
FIG. 18 is a cross sectional view schematically showing a further process of manufacturing the circuit-containing photodetector according to the present invention.

The process as shown in FIG. 18 may be used in the process of the circuit-containing photodetector according to the present invention. Referring to FIG. 18, a conventional photolithography technique, and ion implantation and annealing, or solid phase diffusion or the like is used to simultaneously form a conductive impurity region 36 for signal transmission and an impurity region 33 of the photodetector element. These regions are simultaneously formed in a silicon substrate 1, which has a specific resistance (e.g. 300 Ωcm) and a thickness suitable for a photodetector element and has a buried diffusion layer 8 (e.g. n type) formed therein. In order to form regions 33 and 36, typically, an oxide film with a thickness of 10 to 20 nm is formed by a conventional technique and then the oxide film is patterned by photolithography technique. The patterned film is then used as an implantation protection film, and boron ions for example are implanted with an acceleration energy of 15 to 60 keV and a dose of $1\times10^{13}$ to $1\times10^{16}$ cm$^{-2}$. Additional steps like those of Example 11 for example are carried out to give the circuit-containing photodetector according to the present invention.

As shown in FIG. 18, the simultaneous formation of conductive impurity region 36 for signal transmission and impurity region 33 of the photodetector element can reduce the number of the manufacturing steps and the manufacturing cost. Buried diffusion layer 8 may be formed together with conductive impurity region 36 for signal transmission and impurity region 33 in the same step. In such a case, the number of the manufacturing steps and the production cost can be reduced.

Example 13

Figure 19:
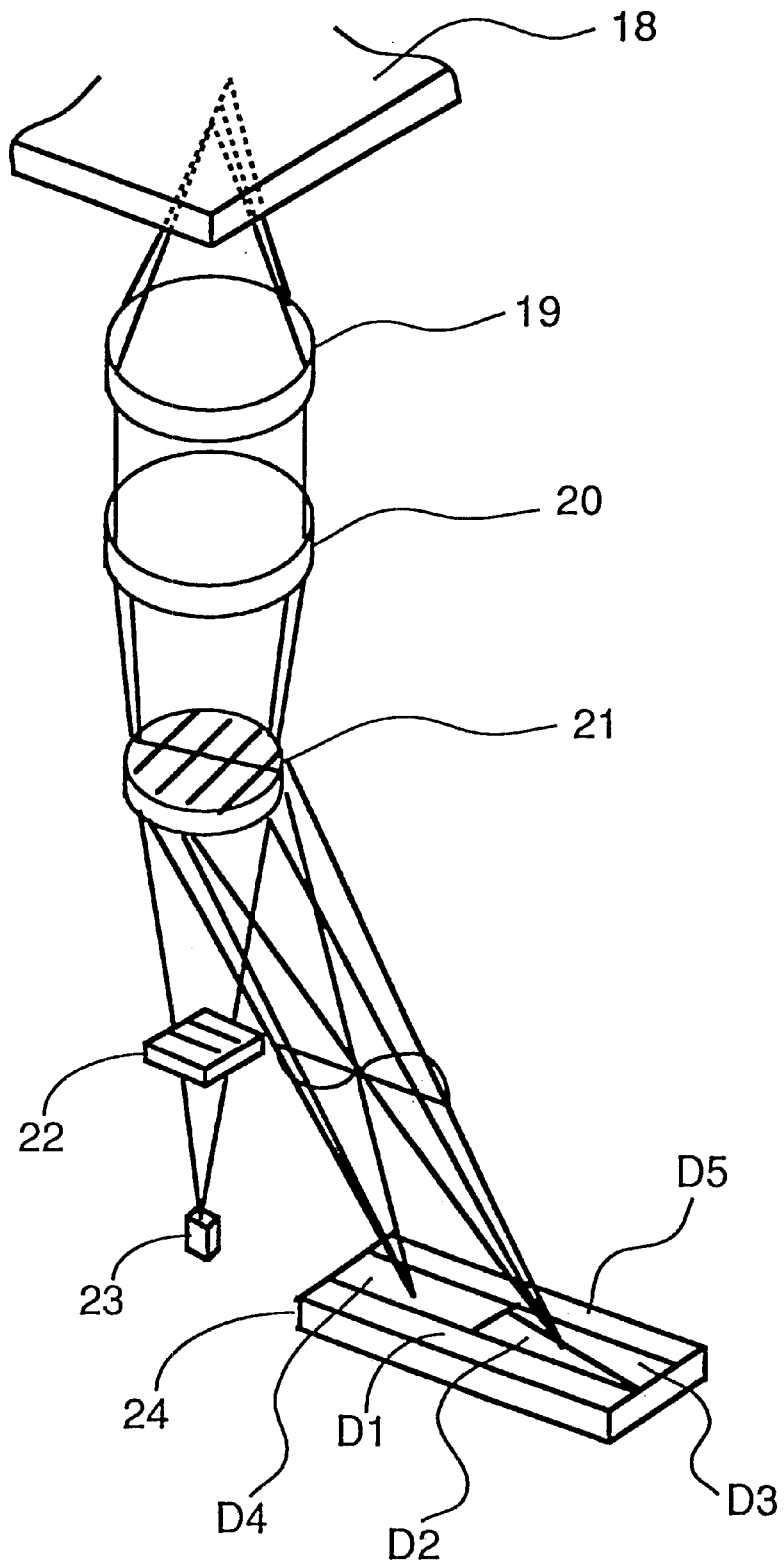
FIG. 19 is a perspective view schematically showing an optical pickup device including a circuit-containing photodetector according to the present invention.

According to the present invention, an optical device (optical pickup device) as shown in FIG. 19 is provided. FIG. 19 shows a main portion of the optical pickup in an optical disk system. In the optical pickup, light emitted from a laser diode 23 is split into three beams including two sub beams for tracking and a main beam for reading information by a diffraction grating 22. Diffraction grating 22 for generating the tracking beams is arranged to face the rear side of a hologram element 21. The beams are passed through hologram element 21 as zero-order light and then converted into parallel beams by a collimator lens 20. The beams are then focused on an optical disk 18 by an objective lens 19. The beams modulated and reflected by the recorded pits on optical disk 18 are passed through objective lens 19 and collimator lens 20 and then diffracted by hologram element 21 to give first-order diffracted light. The light is split into five beams, which are directed respectively to corresponding light-receiving surfaces 24 of a circuit-containing photodetector having photodetector D1 to D5.

Photodetector D1 to D5 all have the structure of the circuit-containing photodetector according to the present invention, so that the optical pickup can have a high sensitivity and a high response to the signal light of a short wavelength.

In the above Examples according to the present invention, the two conductivity types are exchangeable. In other words, the types of all the conductive regions may be inverted between p and n. The resulting effects should be similar to those of the Examples.

According to the present invention, a conductive semiconductor or a silicide conductive region is formed from the impurity region of the photodetector element formed at the bottom of the trench to the upper surface of the epitaxial layer. When a pattern of a metal interconnection is made according to the present invention, the light for photolithography may only be focused on the upper surface of the epitaxial layer. The photolithography is not affected by the step configuration of the trench. According to the present invention, therefore, the problem of the prior art can be solved; in other words, it is possible to improve the production yield of the circuit-containing photodetector by preventing the defect of the metal electrode interconnection.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A circuit-containing photodetector including a semiconductor substrate, a photodetector element formed on said semiconductor substrate, and a circuit for processing an electric signal from said photodetector element, comprising:

a semiconductor layer which is grown on said semiconductor substrate and on which said circuit is formed;

a trench which is formed in said semiconductor layer and has a depth to reach said semiconductor substrate;

an impurity region formed at a surface of said semiconductor substrate exposed at the bottom of said trench, said impurity region constituting said photodetector element; and a conductive impurity region, extending from said impurity region of said photodetector element to an upper surface of said semiconductor layer and in direct contact with a side wall of said trench, for transmitting the electric signal from said photodetector element to said circuit.

2. The device according to claim 1, wherein said conductive impurity region is formed in said semiconductor layer to extend from the bottom of said trench to said upper surface of said semiconductor layer.

3. The device according to claim 1, wherein said conductive impurity region is composed of:

a substrate impurity region formed at a portion of said semiconductor substrate that is adjacent to said trench; and a semiconductor layer impurity region formed in said semiconductor layer to extend from said substrate impurity region to said upper surface of said semiconductor layer.

4. The device according to claim 3, further comprising a buried diffusion layer for said circuit, wherein said buried diffusion layer is formed at a portion of said substrate distant from said substrate impurity region.

5. The device according to claim 3, wherein said substrate impurity region serves to transmit the signal and serves as a buried diffusion layer for said circuit.

6. The device according to claim 3, further comprising a collector compensation diffusion layer for said circuit, wherein said collector compensation diffusion layer is formed at a portion of said semiconductor layer distant from said semiconductor layer impurity region.

7. The device according to claim 3, wherein said semiconductor layer impurity region serves to transmit the signal and serves as a burned diffusion layer for said circuit.

8. The device according to claim 3, wherein said photodetector element includes a plurality of said impurity regions of said photodetector element.

9. The device according to claim 1, wherein said photodetector element includes a plurality of said impurity regions of said photodetector element.

10. An optical device including the circuit-containing photodetector according to claim 1.

11. A circuit-containing photodetector including a semiconductor substrate, a photodetector element formed on said semiconductor substrate, and a circuit for processing an electric signal from said photodetector element, comprising:

a semiconductor layer which is grown on said semiconductor substrate and on which said circuit is formed;

a trench which is formed in said semiconductor layer and has a depth to reach said semiconductor substrate;

an impurity region formed at a surface of said semiconductor substrate exposed at the bottom of said trench, said impurity region constituting said photodetector element; and a silicide film, formed in self-aligning manner from the bottom of said trench to an upper surface of said semiconductor layer and in direct contact with a side wall of said trench, for transmitting the electric signal from said photodetector element to said circuit.

* * * * *